US009837153B1

(12) United States Patent
Rajamohanan et al.

(10) Patent No.: US 9,837,153 B1
(45) Date of Patent: Dec. 5, 2017

(54) SELECTING REVERSIBLE RESISTANCE MEMORY CELLS BASED ON INITIAL RESISTANCE SWITCHING

(71) Applicant: Western Digital Technologies, Inc., Irvine, CA (US)

(72) Inventors: Bijesh Rajamohanan, Fremont, CA (US); Christopher Petti, Mountain View, CA (US); Xinde Hu, San Diego, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 15/468,512

(22) Filed: Mar. 24, 2017

(51) Int. Cl.
*G11C 13/00* (2006.01)
*G06F 12/10* (2016.01)

(52) U.S. Cl.
CPC .......... *G11C 13/0069* (2013.01); *G06F 12/10* (2013.01); *G11C 13/0002* (2013.01); *G11C 13/0035* (2013.01); *G11C 2013/0083* (2013.01)

(58) Field of Classification Search
CPC ............ G11C 13/0069; G11C 13/0002; G11C 13/0035; G11C 2013/0083; G06F 12/10
See application file for complete search history.

(56) References Cited

U.S. PATENT DOCUMENTS

| 8,000,127 | B2 * | 8/2011 | Hamilton | ............... | B82Y 10/00 |
| | | | | | 365/100 |
| 8,108,592 | B2 * | 1/2012 | Kim | .................... | G06F 12/0246 |
| | | | | | 711/103 |
| 8,216,862 | B2 * | 7/2012 | Kreupl | ............... | G11C 13/0007 |
| | | | | | 257/E21.068 |
| 8,255,613 | B2 | 8/2012 | Abali et al. | | |
| 8,274,815 | B2 * | 9/2012 | Ichihara | .................. | G11C 11/00 |
| | | | | | 365/148 |

(Continued)

FOREIGN PATENT DOCUMENTS

EP 2709110 A1 3/2014

OTHER PUBLICATIONS

Park, Dongchul, et al. "Hot and Cold Data Identification for Flash Memory Using Multiple Bloom Filters," Department of Computer Science and Engineering, University of Minnesota—Twin Cities, Feb. 2011, 2 pages.

*Primary Examiner* — Vanthu Nguyen
(74) *Attorney, Agent, or Firm* — Vierra Magen Marcus LLP

(57) ABSTRACT

Technology is described for selecting a group of reversible-resistance memory cells in which to store data based on information regarding switching the reversible-resistance memory cells from a first resistance state in which the reversible-resistance memory cells are in immediately after fabrication to a second resistance state for the first time after fabrication. Information regarding switching the reversible-resistance memory cells from the first resistance state to the second resistance state for the first time after fabrication may provide insight into factors including, but not limited to, endurance and data retention. In one aspect, a control circuit is configured to select a group of reversible-resistance memory cells in which to store data based on both the difficulty in switching from the first resistance state to the second resistance state for the first time after fabrication and a temperature of the data to be stored in the memory system.

21 Claims, 25 Drawing Sheets

(56) References Cited

U.S. PATENT DOCUMENTS

| | | | |
|---|---|---|---|
| 8,374,019 B2* | 2/2013 | Wu | G11C 11/5678 |
| | | | 365/148 |
| 8,467,238 B2* | 6/2013 | Wu | G11C 13/0004 |
| | | | 365/158 |
| 9,053,790 B1 | 6/2015 | Hu et al. | |
| 9,183,925 B2* | 11/2015 | Katoh | G11C 13/0007 |
| 2011/0320688 A1 | 12/2011 | Lee | |
| 2012/0311228 A1 | 12/2012 | Hsu et al. | |
| 2012/0317337 A1 | 12/2012 | Johar et al. | |
| 2013/0346812 A1 | 12/2013 | Bahirat et al. | |
| 2015/0186258 A1* | 7/2015 | Edelhaeuser | G06F 12/0246 |
| | | | 711/103 |
| 2016/0139812 A1 | 5/2016 | Zhang | |

* cited by examiner

700

Access information regarding switching groups of reversible resistivity memory cells from a virgin resistance state to a different resistance state for a first time, 702

Select a group of the reversible-resistivity memory cells to store data based on the information, 704

Store data in the selected group, 706

Access temperature of data to be stored, 802

Access information regarding switching groups of reversible resistivity memory cells from a virgin resistance state to a different resistance state for a first time, 804

Select a group of the reversible-resistivity memory cells to store data based on the information and on the temperature, 806

Store data in the selected group, 808

SELECTING REVERSIBLE RESISTANCE MEMORY CELLS BASED ON INITIAL RESISTANCE SWITCHING

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory system allows information to be stored or retained even when the non-volatile memory system is not connected to a source of power (e.g., a battery).

One type of non-volatile memory cell is a reversible-resistance memory cell. A reversible-resistance memory cell may be repeatedly switched between two or more resistance states. The process of switching the resistance of a reversible-resistance memory cell from a high-resistance state to a low-resistance state may be referred to as setting the reversible-resistance memory cell. The process of switching the resistance from the low-resistance state to the high-resistance state may be referred to as resetting the reversible-resistance memory cell.

The resistance state that a reversible-resistance memory cell is in immediately after fabrication will be referred to herein as a "virgin" resistance state. Some reversible-resistance memory cells are in a high resistance state immediately after fabrication. The first time that such reversible-resistance memory cells are switched from the "virgin" high resistance state to a low resistance state is typically referred to as a "forming" operation. Some reversible-resistance memory cells are in a low resistance state immediately after fabrication. Such memory cells may be switched from the "virgin" low resistance state to a high resistance state. The first time that such reversible-resistance memory cells are switched from the virgin low resistance state to a high resistance state may be referred to herein as an "initialization" operation.

BRIEF DESCRIPTION OF THE DRAWINGS

FIG. 7 is a flowchart of one embodiment of a process of selecting a group of reversible-resistance memory cells in which to store a unit of data based on information pertaining to switching from a virgin resistance state to a target resistance state for the first time after fabrication.

FIG. 8 is a flowchart of one embodiment of a process of selecting a group of reversible-resistance memory cells in which to store a unit of data based on data temperature and information pertaining to switching from the virgin resistance state to a different resistance state for the first time after fabrication.

DETAILED DESCRIPTION

Figure 1A:
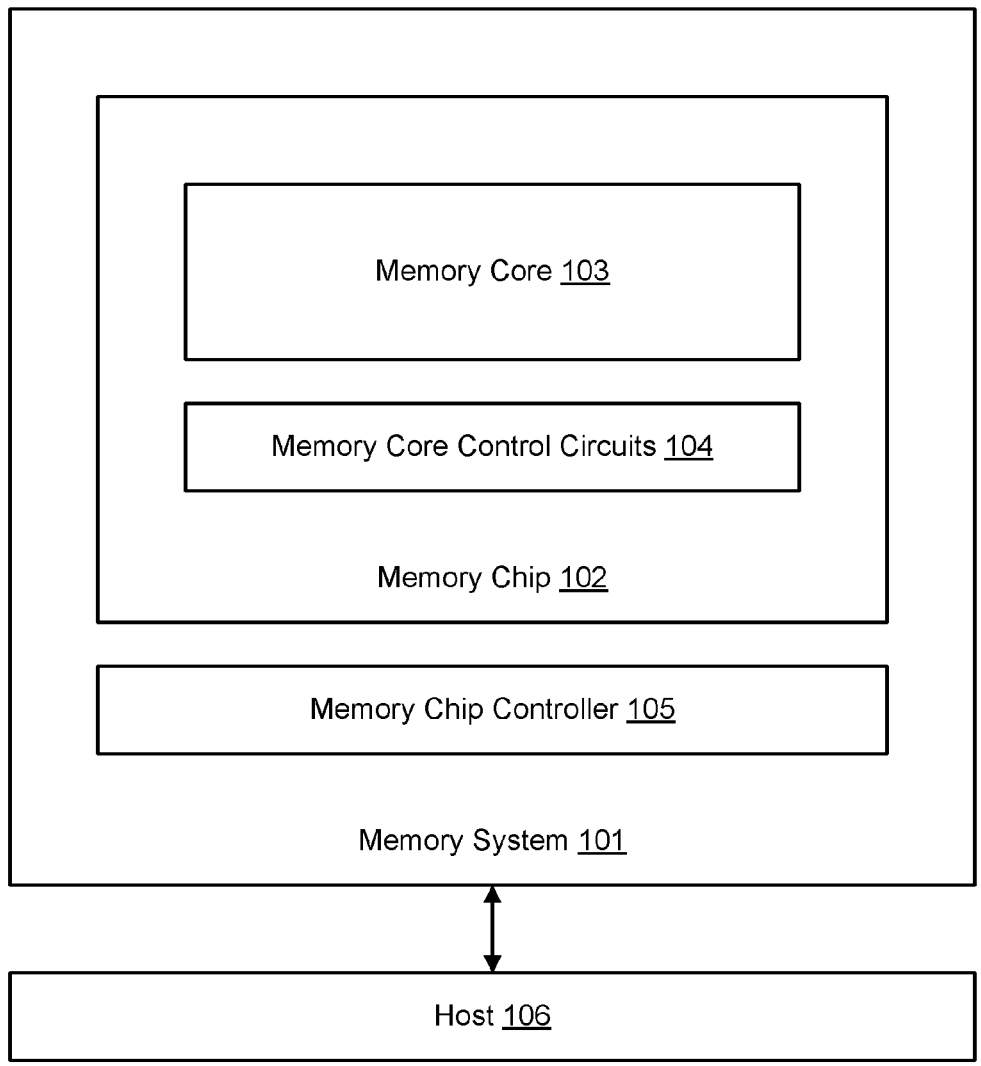
FIGS. 1A-1I depict various embodiments of a memory system.

Technology is described for selecting a group of reversible-resistance memory cells in which to store data based on information regarding switching the reversible-resistance memory cells from a virgin resistance state to a different resistance state for the first time after fabrication of the reversible-resistance memory cells. A forming operation may be used to switch some reversible-resistance memory cells from a virgin high resistance state to a low resistance state for the first time. An initialization operation may be used to switch some reversible-resistance memory cells from virgin low resistance state to a high resistance state for the first time. The information regarding switching the reversible-resistance memory cells from a virgin resistance state to a different resistance state for the first time after fabrication may provide insight into factors including, but not limited to, endurance and data retention. Thus, the information might suggest which reversible-resistance memory cells may be expected to have high, low, medium, etc. data retention. As another example, the information might suggest which reversible-resistance memory cells may be expected to have high, low, medium, etc. endurance.

In one embodiment, the information regarding switching the reversible-resistance memory cells from a virgin resistance state to a different resistance state for the first time after fabrication pertains to the difficulty in switching the reversible-resistance memory cells from the virgin high resistance state to another resistance state for the first time after fabrication. In one embodiment, the difficulty in switching the reversible-resistance memory cells from a virgin high resistance state to a low resistance state for the first time after fabrication is assessed based on how many iterations of a multi-iteration forming operation are needed to switch from a virgin high resistance state to a low resistance state. In one embodiment, the difficulty in switching the reversible-resistance memory cells from a virgin low resistance state to a high resistance state for the first time after fabrication is assessed based on how many iterations of a multi-iteration initialization operation are needed to switch from a virgin low resistance state to a high resistance state. For some reversible-resistance memory cells, the difficulty in switching from a virgin resistance state to a different resistance state for the first time after fabrication may provide insight into factors including, but not limited to, endurance and data retention.

In one embodiment, a control circuit is configured to select a group of reversible-resistance memory cells in which to store data based on both the difficulty in switching from a virgin resistance state to a different resistance state for the first time after fabrication and a temperature of the data to be stored in the memory system. The temperature of the data may pertain to how frequently the data has been written or is expected to be written.

In one embodiment, a wear leveling algorithm factors in the information regarding switching the reversible-resistance memory cells from a virgin resistance state to a different resistance state for the first time after fabrication. The wear leveling algorithm may also factor in the temperature of the data.

In embodiments, the reversible-resistance memory cells include a reversible-resistance switching element (also referred to as a "reversible resistivity-switching element"). A reversible-resistance switching element may include a reversible-resistance switching material having a resistance that may be reversibly switched between two or more states. In one embodiment, the reversible-resistance-switching material may include a metal oxide (e.g., a binary metal oxide). The metal oxide is a transition metal oxide, in one embodiment. The metal oxide may include nickel oxide, hafnium oxide, titanium oxide, etc. In another embodiment, the reversible-resistance-switching material may include a phase change material. The phase change material may include a chalcogenide material.

In one embodiment, the reversible-resistance memory cells may comprise conductive bridge memory cells or programmable metallization memory cells. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature. Note that reversible-resistance memory cells are not limited to the examples in this and the prior paragraph.

In some embodiments, a memory array of reversible-resistance memory cells may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a reversible-resistance-switching material. In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile memory system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible-resistance-switching element without an isolation element in series with the reversible-resistance-switching element (e.g., no diode in series with the reversible-resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 101 and a host 106. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
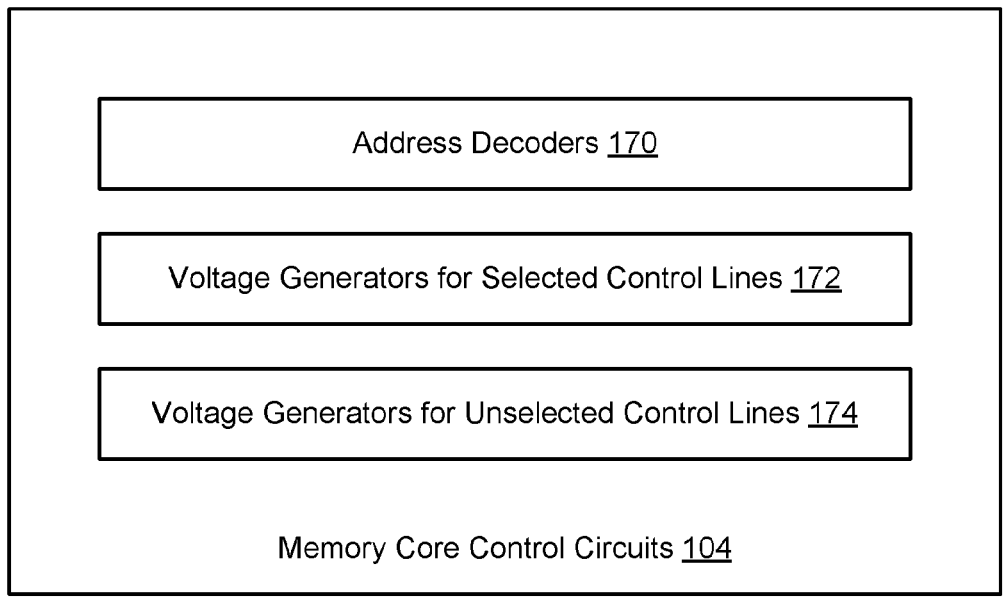

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
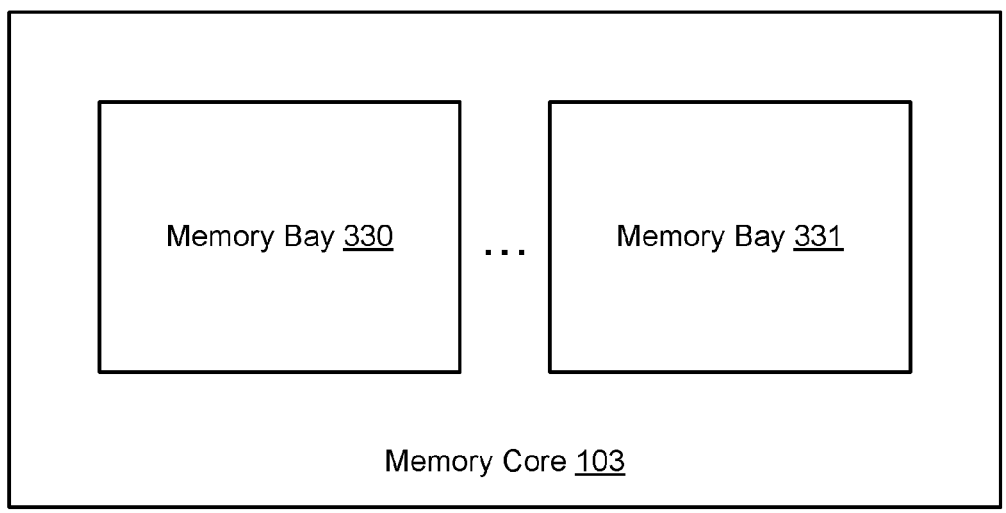

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays or 256 memory bays).

Figure 1D:
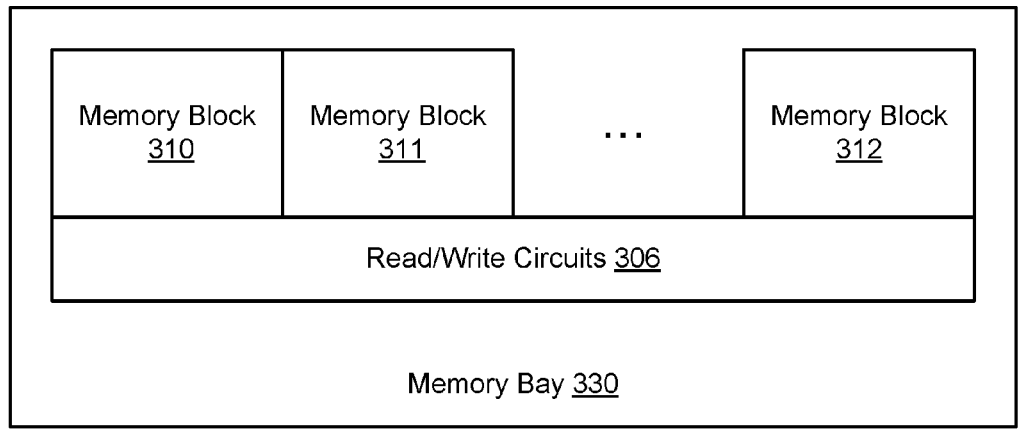

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 306 may be used to program a particular memory cell to be in one of three or more data/resistance states (i.e., the particular memory cell may comprise a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
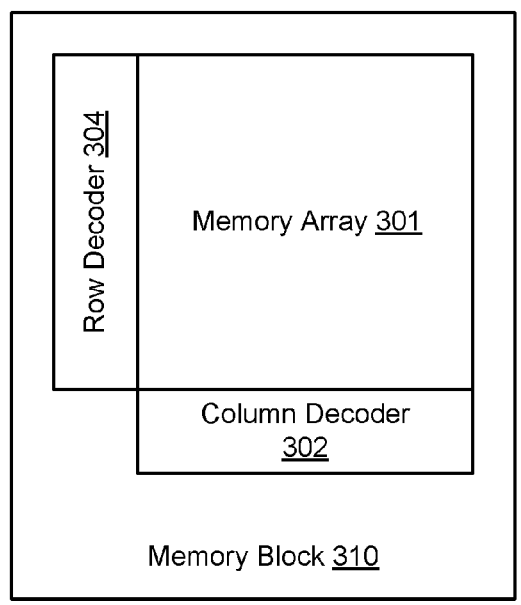

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells. Memory array 310 may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
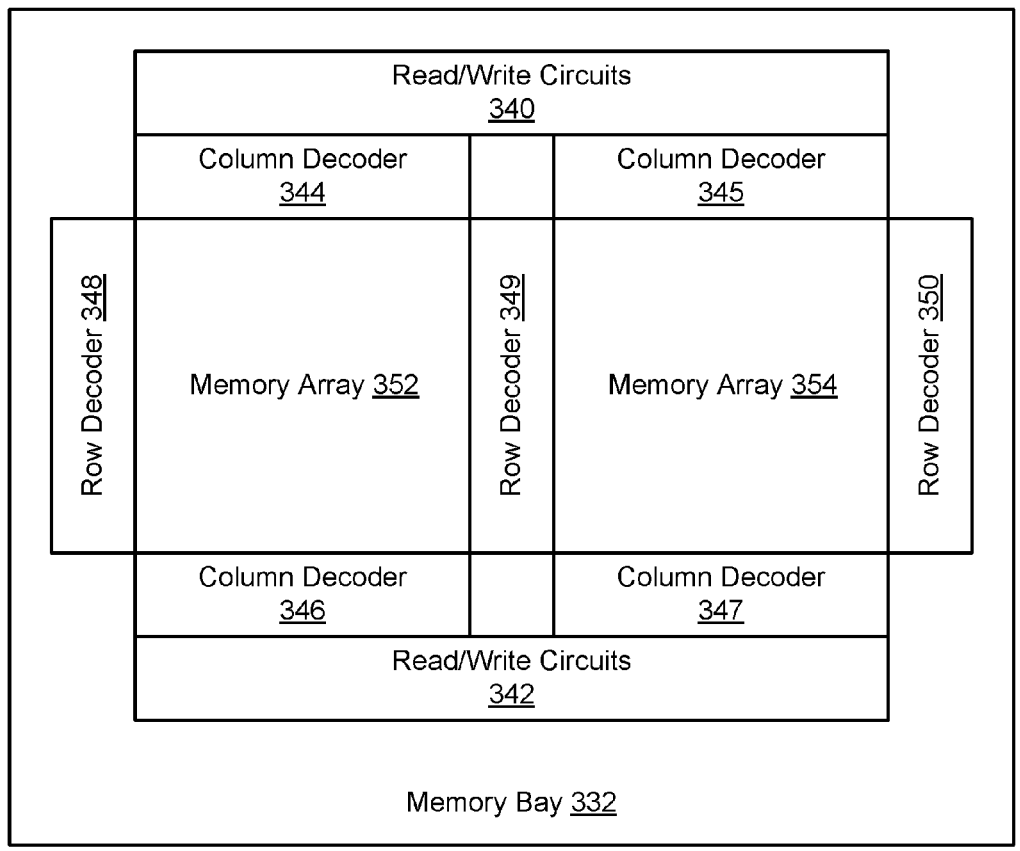

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

Figure 1G:
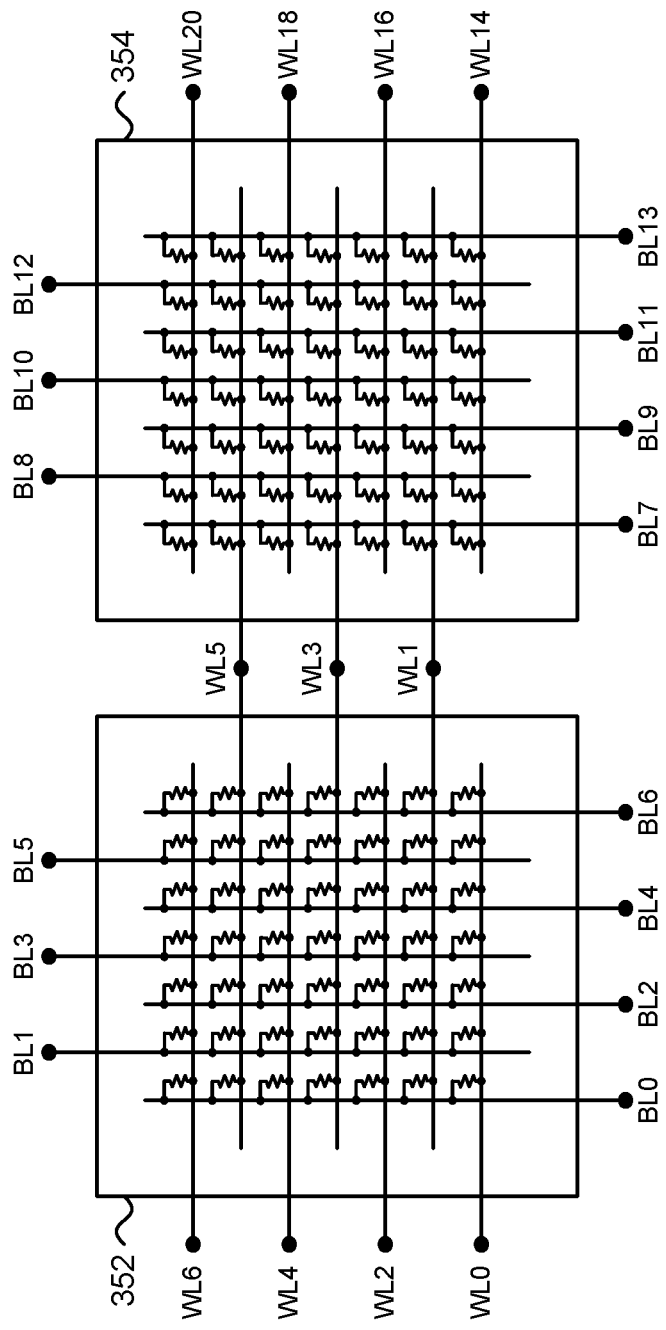

FIG. 1G depicts one embodiment of a schematic diagram (including word lines and bit lines) corresponding with memory bay 332 in FIG. 1F. As depicted, word lines WL1, WL3, and WL5 are shared between memory arrays 352 and 354 and controlled by row decoder 349 of FIG. 1F. Word lines WL0, WL2, WL4, and WL6 are driven from the left side of memory array 352 and controlled by row decoder 348 of FIG. 1F. Word lines WL14, WL16, WL18, and WL20 are driven from the right side of memory array 354 and controlled by row decoder 350 of FIG. 1F. Bit lines BL0, BL2, BL4, and BL6 are driven from the bottom of memory array 352 and controlled by column decoder 346 of FIG. 1F. Bit lines BL1, BL3, and BL5 are driven from the top of memory array 352 and controlled by column decoder 344 of FIG. 1F.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical with respect to the supporting substrate (i.e., the vertical plane is perpendicular to the supporting substrate). In this case, the bit lines of the memory arrays may comprise vertical bit lines.

Figure 1H:
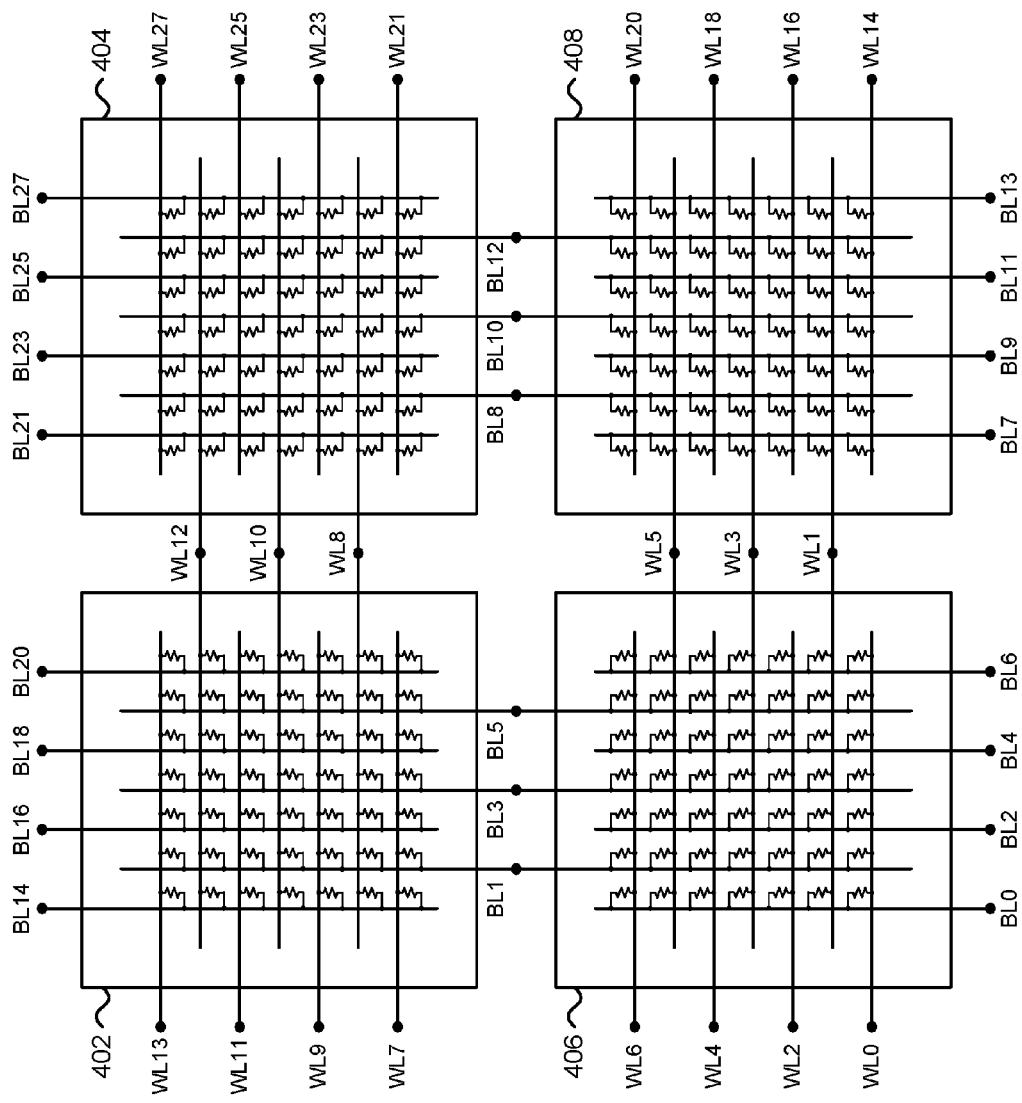

FIG. 1H depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area since a single row decoder and/or column decoder can be used to support two memory arrays. As depicted, word lines WL1, WL3, and WL5 are shared between memory arrays 406 and 408. Bit lines BL1, BL3, and BL5 are shared between memory arrays 406 and 402. Row decoders are split such that word lines WL0, WL2, WL4, and WL6 are driven from the left side of memory array 406 and word lines WL1, WL3, and WL5 are driven from the right side of memory array 406. Column decoders are split such that bit lines BL0, BL2, BL4, and BL6 are driven from the bottom of memory array 406 and bit lines BL1, BL3, and BL5 are driven from the top of memory array 406. Splitting row and/or column decoders also helps to relieve layout constraints (e.g., the column decoder pitch can be relieved by 2× since the split column decoders need only drive every other bit line instead of every bit line).

Figure 1I:
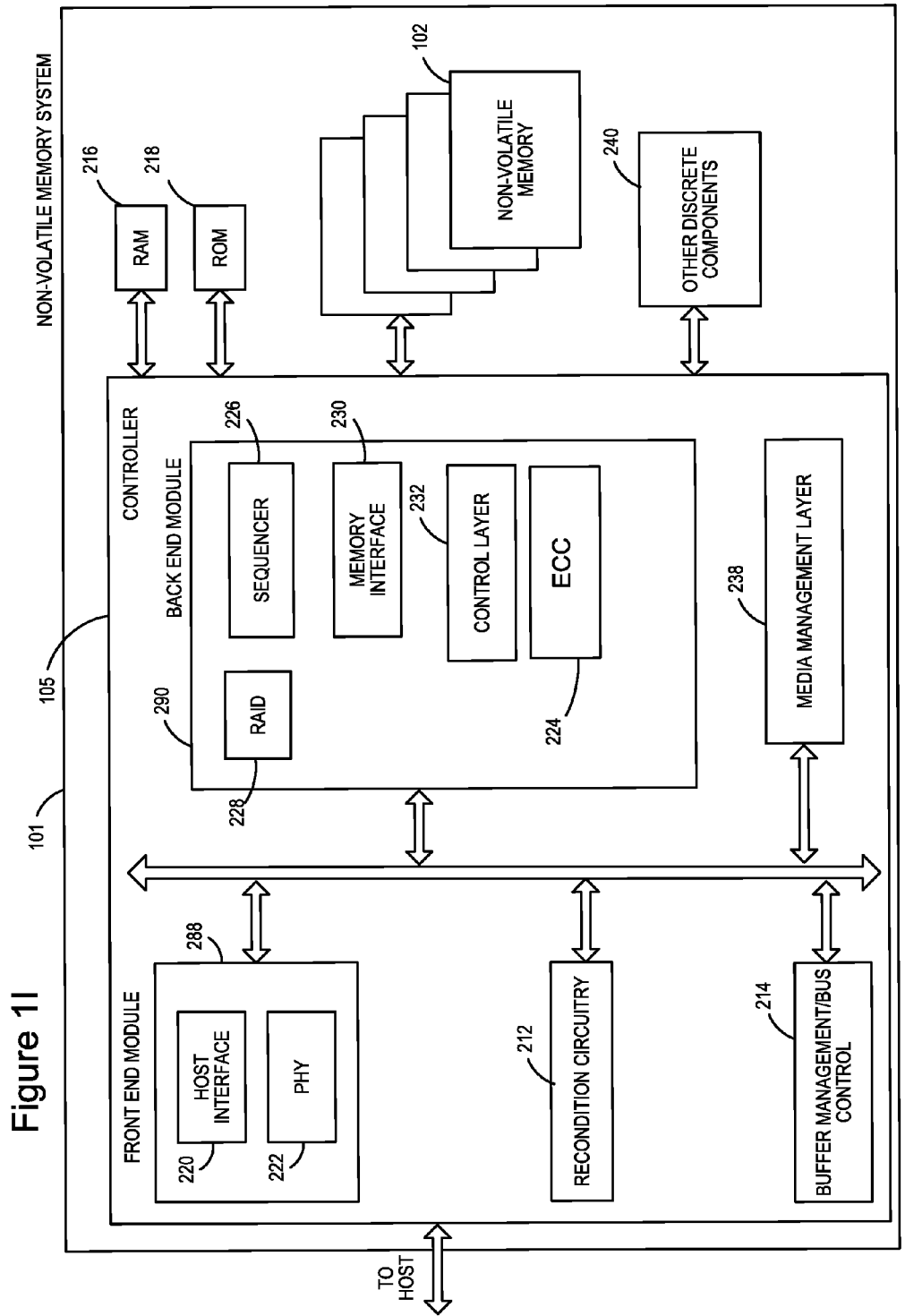

FIG. 1I is a block diagram of example memory system 101, depicting further details of one embodiment of Controller 105 of FIG. 1A. In one embodiment, the system of FIG. 1I is a solid state drive. As used herein, a memory Controller is a device that manages data stored in the memory system 101 and communicates with a host, such as a computer or electronic device. A memory Controller can have various functionality in addition to the specific functionality described herein. For example, the memory Controller can format the memory to ensure the memory is operating properly, map out bad memory cells, and allocate spare memory cells to be substituted for future failed cells. Some part of the spare cells can be used to hold firmware to operate the memory Controller and implement other features. In operation, when a host needs to read data from or write data to the memory, it will communicate with the memory Controller. If the host provides a logical address (LA) to which data is to be read/written, the memory Controller can convert the logical address received from the host to a physical address in the memory. In one embodiment, the controller converts the logical address to a physical address based on information regarding switching groups of reversible-resistance-switching memory cells from a virgin resistance state to a target resistance state for the first time after fabrication of the cells. (Alternatively, the host can provide the physical address). The memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). In one embodiment, wear leveling is based on information regarding switching groups of reversible-resistance-switching memory cells from a virgin resistance state to a different resistance state for the first time after fabrication of the cells.

The interface between Controller 105 and non-volatile memory die 108 may be any suitable interface. In one embodiment, memory system 100 may be a card based system, such as a secure digital (SD) or a micro secure digital (micro-SD) card. In an alternative embodiment, memory system 100 may be part of an embedded memory system. For example, the memory may be embedded within the host, such as in the form of a solid state disk (SSD) drive installed in a personal computer.

In some embodiments, non-volatile memory system 101 includes a single channel between Controller 105 and non-volatile memory die 102, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 1I, Controller 105 includes a front end module 288 that interfaces with a host, a back end module 290 that interfaces with the one or more non-volatile memory die 102, and various other modules that perform functions which will now be described in detail.

The components of Controller 105 depicted in FIG. 1I may take the form of a packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include or comprise software stored in a processor readable device (e.g., memory) to program a one or more processors for Controller 105 to perform the functions described herein.

Controller 105 may include recondition circuitry 212, which is used for reconditioning memory cells or blocks of memory. The reconditioning may include refreshing data in its current location or reprogramming data into a new word line or block as part of performing erratic word line maintenance.

Referring again to modules of the Controller 105, a buffer manager/bus Controller 214 manages buffers in random access memory (RAM) 216 and controls the internal bus arbitration of Controller 122. A read only memory (ROM) 218 stores system boot code. Although illustrated in FIG. 1I as located separately from the Controller 122, in other embodiments one or both of the RAM 216 and ROM 218 may be located within the Controller. In yet other embodiments, portions of RAM and ROM may be located both within the Controller 105 and outside the Controller. Further, in some implementations, the Controller 105, RAM 216, and ROM 218 may be located on separate semiconductor die.

In one embodiment, ROM 218 stores information regarding switching groups of reversible-resistance memory cells in the dies 102 from a virgin resistance state to a target resistance state for the first time after fabrication of the reversible-resistance memory cells. This information may characterize different groups of memory cells, such as a page or byte of cells. Note that the information may be based on an average for the cells in the group. In one embodiment, this information is based on how many iterations of a multi-iteration forming process were used to switch the cells in a group from a virgin high resistance state to a low resistance state. In one embodiment, this information is based on how many iterations of a multi-iteration initialization process were used to switch the cells in a group from a virgin low resistance state to a high resistance state. In one embodiment, groups of memory cells are in different bins, with each bin corresponding to a range of iterations of a multi-iteration forming process used for that group. In one embodiment, groups of memory cells are in different bins, with each bin corresponding to a range of iterations of a multi-iteration initialization process used for that group.

Front end module 288 includes a host interface 220 and a physical layer interface (PHY) 222 that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 290 includes an error correction Controller (ECC) engine 224 that encodes the data bytes received from the host, and decodes and error corrects the data bytes read from the non-volatile memory. In one embodiment, the ECC engine 224 comprises a low-density parity check (LDPC) decoder.

A command sequencer 226 generates command sequences, such as program and erase command sequences, to be transmitted to non-volatile memory die 102. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface. A control layer 232 controls the overall operation of back end module 290.

Additional components of system 101 illustrated in FIG. 1I include media management layer 238, which performs wear leveling of memory cells of non-volatile memory die 102. System 101 also includes other discrete components 240, such as external electrical interfaces, external RAM, resistors, capacitors, or other components that may interface with Controller 105. In alternative embodiments, one or more of the physical layer interface 222, RAID module 228, media management layer 238 and buffer management/bus Controller 214 are optional components that are not necessary in the Controller 105.

The Media Management Layer (MML) 238 may be responsible for the internals of non-volatile memory management. In particular, the MML 238 may include an algorithm in the memory device firmware which translates writes from the host into writes to the memory of die 102.

Controller 105 may interface with one or more memory dies 102. In one embodiment, Controller 105 and multiple memory dies (together comprising non-volatile storage system 101) implement a solid state drive (SSD), which can emulate, replace or be used instead of a hard disk drive inside a host, as a NAS device, etc. Additionally, the SSD need not be made to work as a hard drive.

Figure 2A:
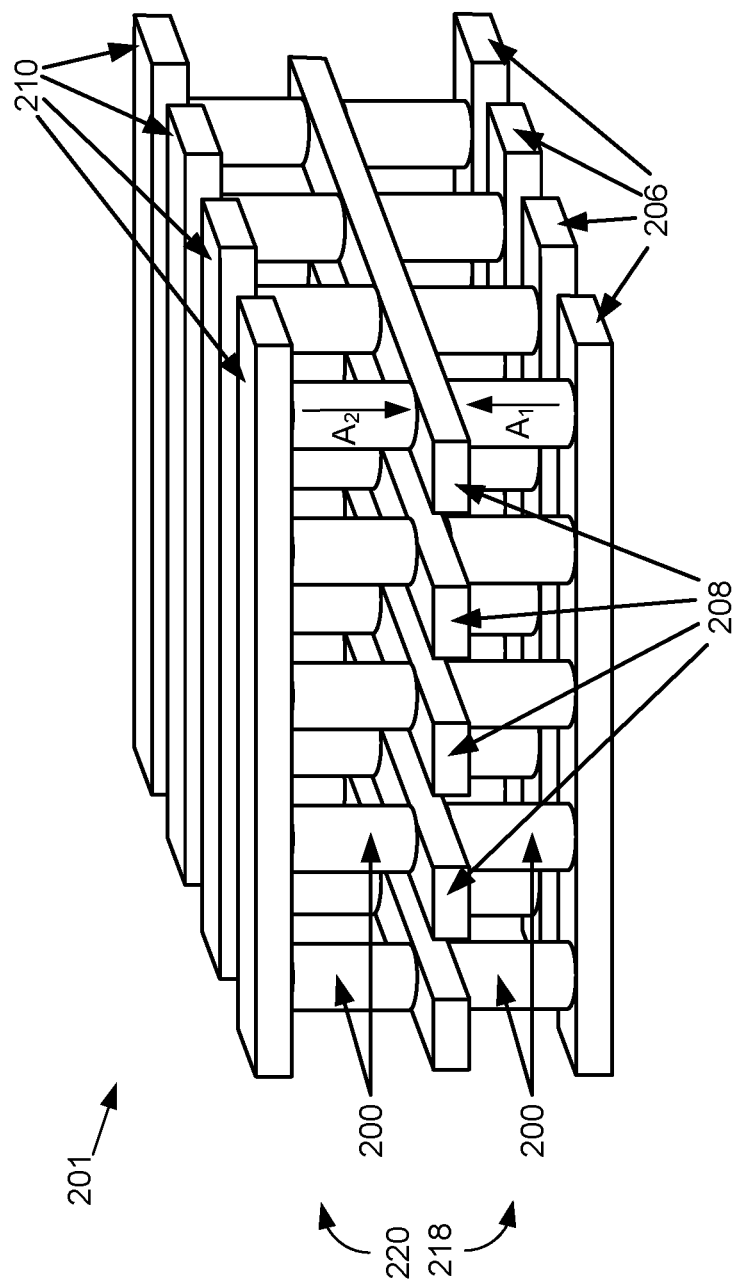
FIGS. 2A-2B depict various embodiments of a portion of a three-dimensional memory array.

FIG. 2A depicts one embodiment of a portion of a monolithic three-dimensional memory array 201 that includes a second memory level 220 positioned above a first memory level 218. Memory array 201 is one example of an implementation for memory array 301 in FIG. 1E. Memory array 201 is one example of an implementation for memory arrays 352, 354 in FIG. 1F. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 2A, memory array 201 includes a plurality of memory cells 200. The memory cells 200 may include reversible-resistance memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

Referring to FIG. 2A, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 2A, in one embodiment of a write operation, the reversible resistivity-switching material may be in an initial ("virgin") high-resistivity state that is switchable to a low-resistivity state upon application of a first voltage and/or current. Application of a second voltage and/or current may return the reversible resistivity-switching material back to the high-resistivity state. Alternatively, the reversible resistivity-switching material may be in an initial ("virgin") low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistivity-switching element from a high-resistivity state to a low-resistivity state may be referred to as SETTING the reversible resistivity-switching element. The process of switching the resistance from the low-resistivity state to the high-resistivity state may be referred to as RESETTING the reversible-resistance-switching element. The high-resistivity state may be associated with binary data "1" and the low-resistivity state may be associated with binary data "0." In other embodiments, SETTING and RESETTING operations and/or the data encoding may be reversed. For example, the high-resistivity state may be associated with binary data "0" and the low-resistivity state may be associated with binary data "1." In some embodiments, a higher than normal programming voltage may be required the first time a reversible-resistance-switching element is SET into the low-resistivity state as the reversible-resistance-switching element may have been placed into a resistance state that is higher than the high-resistivity state when fabricated. The term "FORMING" may refer to the switching of a reversible-resistance-switching element that had a virgin high resistivity state into a low-resistivity state for the first time after fabrication. The term "INITIALIZATION" may refer to the switching of a reversible-resistance-switching element that had a virgin low resistivity state from the virgin low resistivity state into a high-resistivity state for the first time after fabrication. Typically, after a FORMING operation, INITIALIZATION operation, or a memory cell preconditioning operation has been performed, the reversible-resistance-switching element may be RESET to the high-resistivity state and then SET again to the low-resistivity state.

Referring to FIG. 2A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 2B:
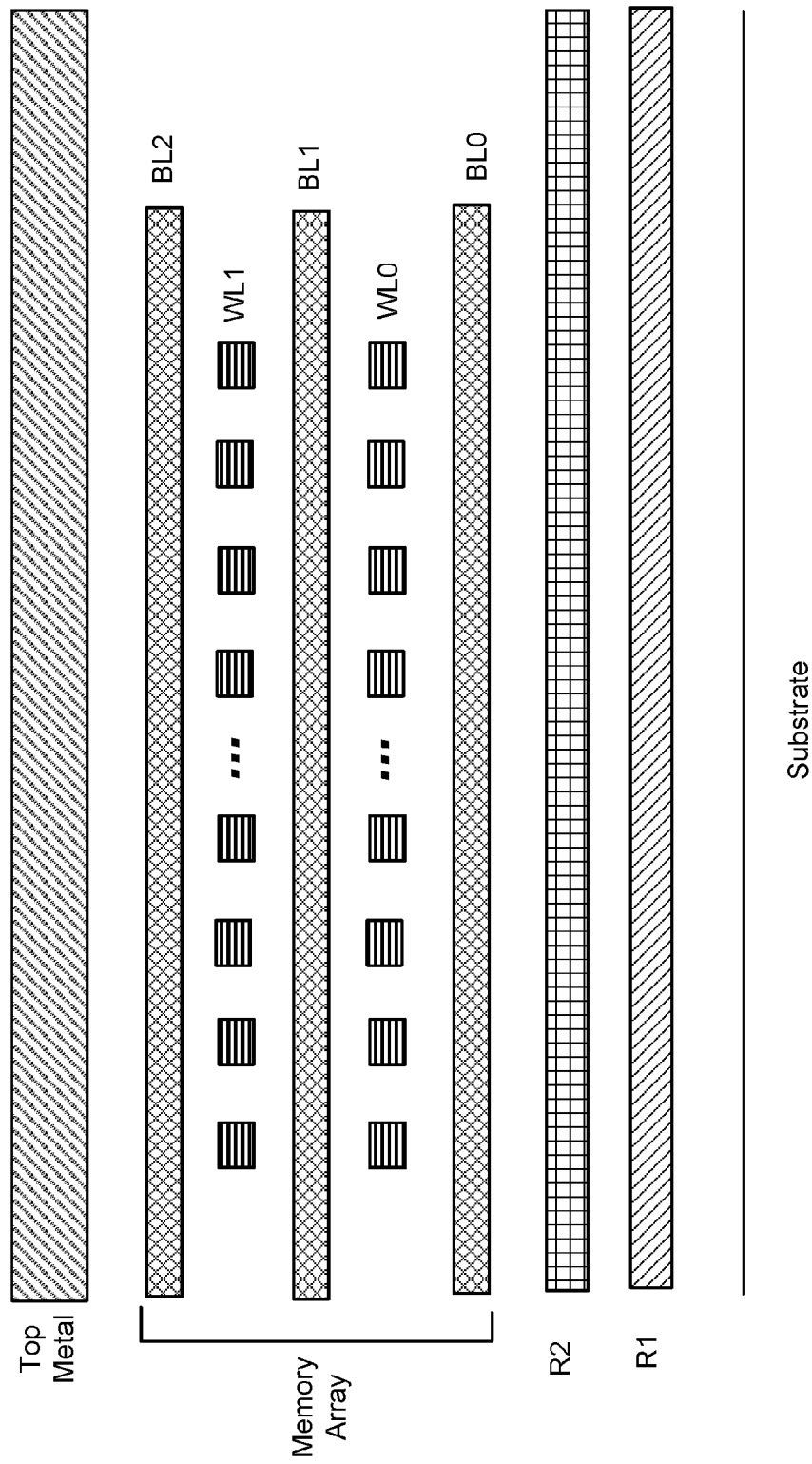

FIG. 2B depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 2B, two metal layers R1 and R2 may be used for routing layers; however, other embodiments can include more or less than two metal layers. In one example, these metal layers R1 and R2 may be formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 3A:
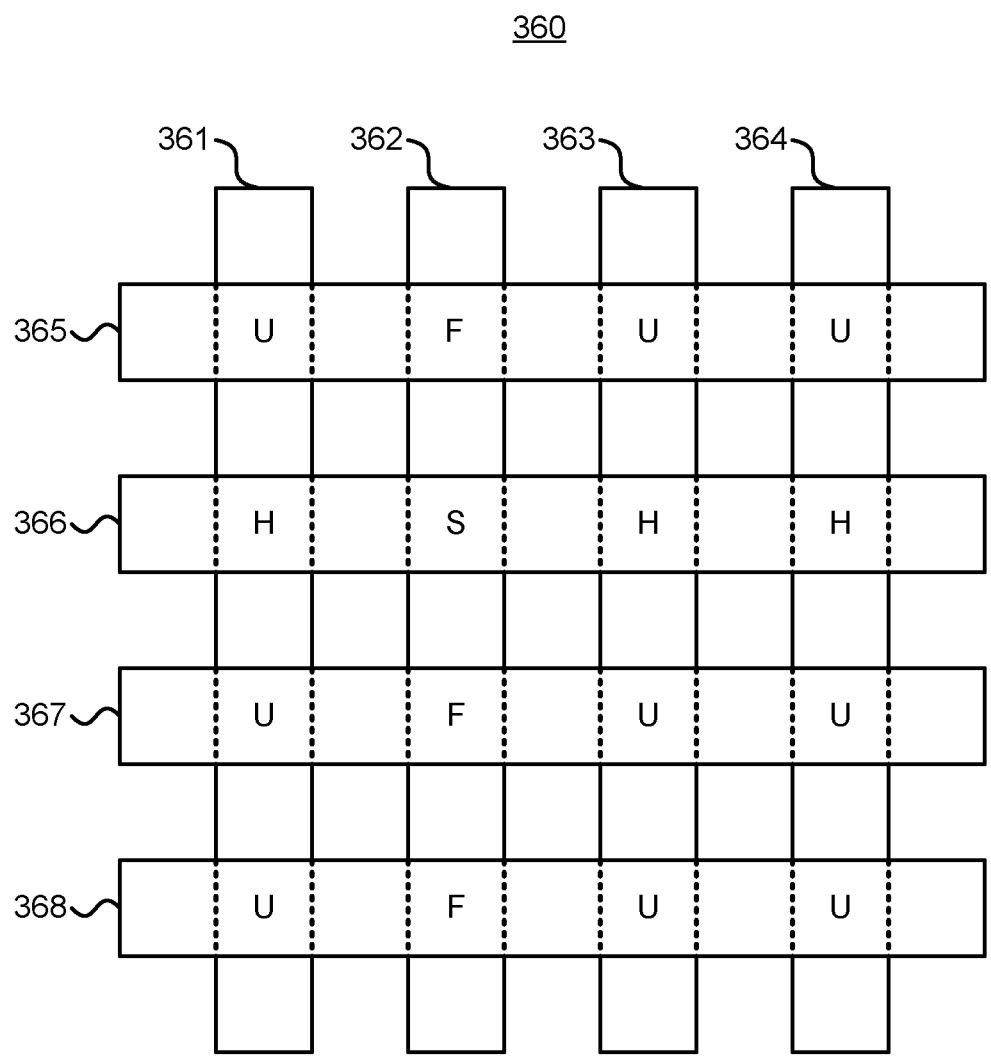
FIGS. 3A-3B depict embodiments of a cross-point memory array.

FIG. 3A depicts one embodiment of a cross-point memory array 360. In one example, the cross-point memory array 360 may correspond with memory array 201 in FIG. 2A. As depicted, cross-point memory array 360 includes word lines 365-368 and bit lines 361-364. The bit lines 361 may comprise vertical bit lines or horizontal bit lines. Word line 366 comprises a selected word line and bit line 362 comprises a selected bit line. At the intersection of selected word line 366 and selected bit line 362 is a selected memory cell (an S cell). The voltage across the S cell is the difference between the selected word line voltage and the selected bit line voltage. Memory cells at the intersections of the selected word line 366 and the unselected bit lines 361, 363, and 364 comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 362 and the unselected word lines 365, 367, and 368 comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 365, 367, and 368 and the unselected bit lines 361, 363, and 364 comprise unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 365, may be associated with a particular page stored within the cross-point memory array 360.

Figure 3B:
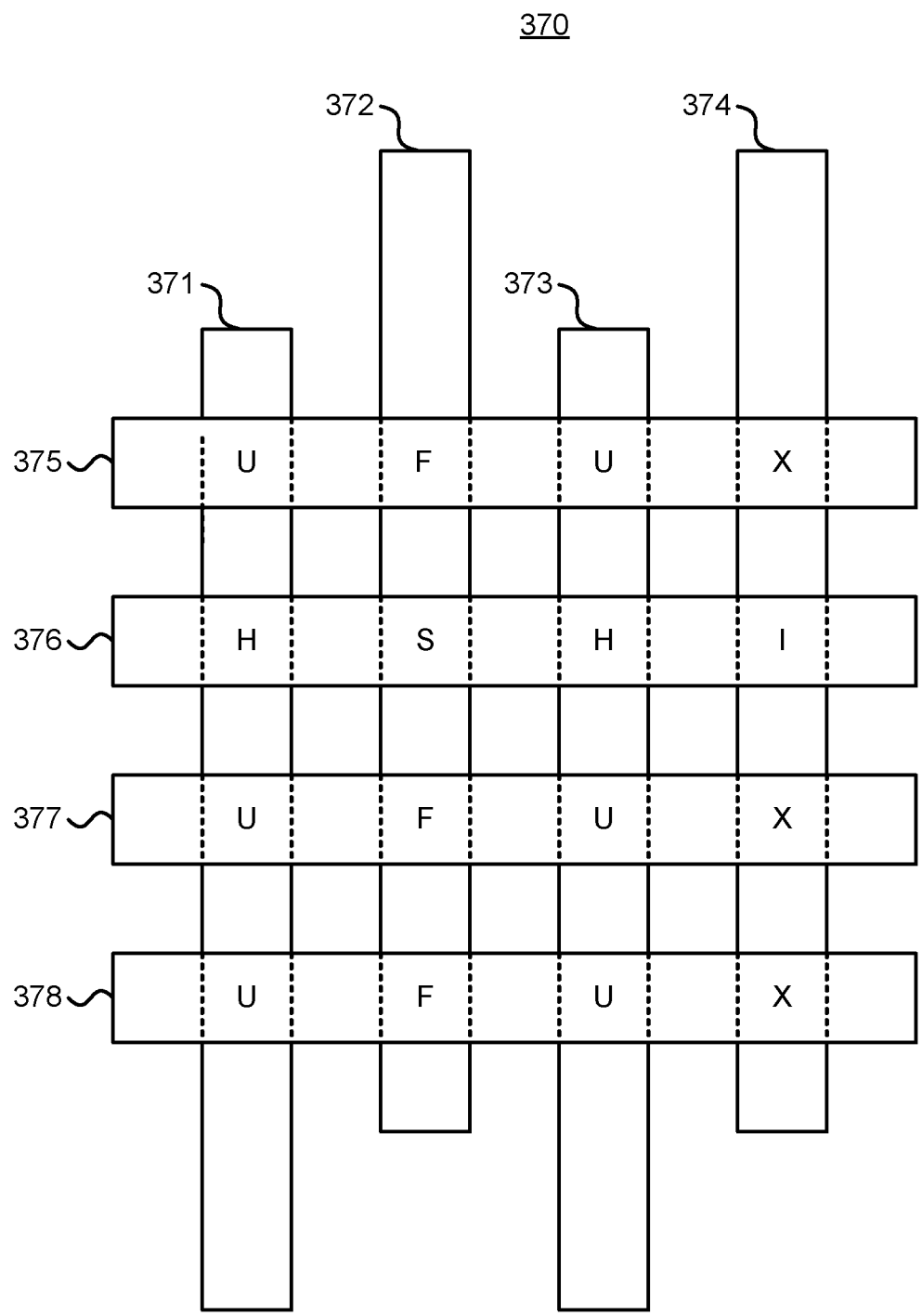

FIG. 3B depicts an alternative embodiment of a cross-point memory array 370. In one example, the cross-point memory array 370 may correspond with memory array 201 in FIG. 2A. As depicted, cross-point memory array 370 includes word lines 375-378 and bit lines 371-374. The bit lines 361 may comprise vertical bit lines or horizontal bit lines. Word line 376 comprises a selected word line and bit lines 372 and 374 comprise selected bit lines. Although both bit lines 372 and 374 are selected, the voltages applied to bit line 372 and bit line 374 may be different. For example, in the case that bit line 372 is associated with a first memory cell to be programmed (i.e., an S cell), then bit line 372 may be biased to a selected bit line voltage in order to program the first memory cell. In the case that bit line 374 is associated with a second memory cell that is not to be programmed (i.e., an I cell), then bit line 374 may be biased to a program inhibit voltage (i.e., to a bit line voltage that will prevent the second memory cell from being programmed).

At the intersection of selected word line 376 and selected bit line 374 is a program inhibited memory cell (an I cell). The voltage across the I cell is the difference between the selected word line voltage and the program inhibit voltage. Memory cells at the intersections of the selected bit line 374 and the unselected word lines 375, 377, and 378 comprise unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 374 may be the same as or substantially the same as the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 375 may be associated with a first page and a second page. The first page may correspond with bit lines 371 and 373 and the second page may correspond with bit lines 372 and 374. In this case, the first page and the second page may correspond with interdigitated memory cells that share the same word line. When a memory array operation is being performed on the first page (e.g., a programming operation) and the selected word line 376 is biased to the selected word line voltage, one or more other pages also associated with the selected word line 376 may comprise H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 370 may comprise resistive memory elements without isolating diodes. In one embodiment, the bit lines 372 and 373 may comprise vertical bit lines in a three dimensional memory array comprising comb shaped word lines.

Figure 4A:
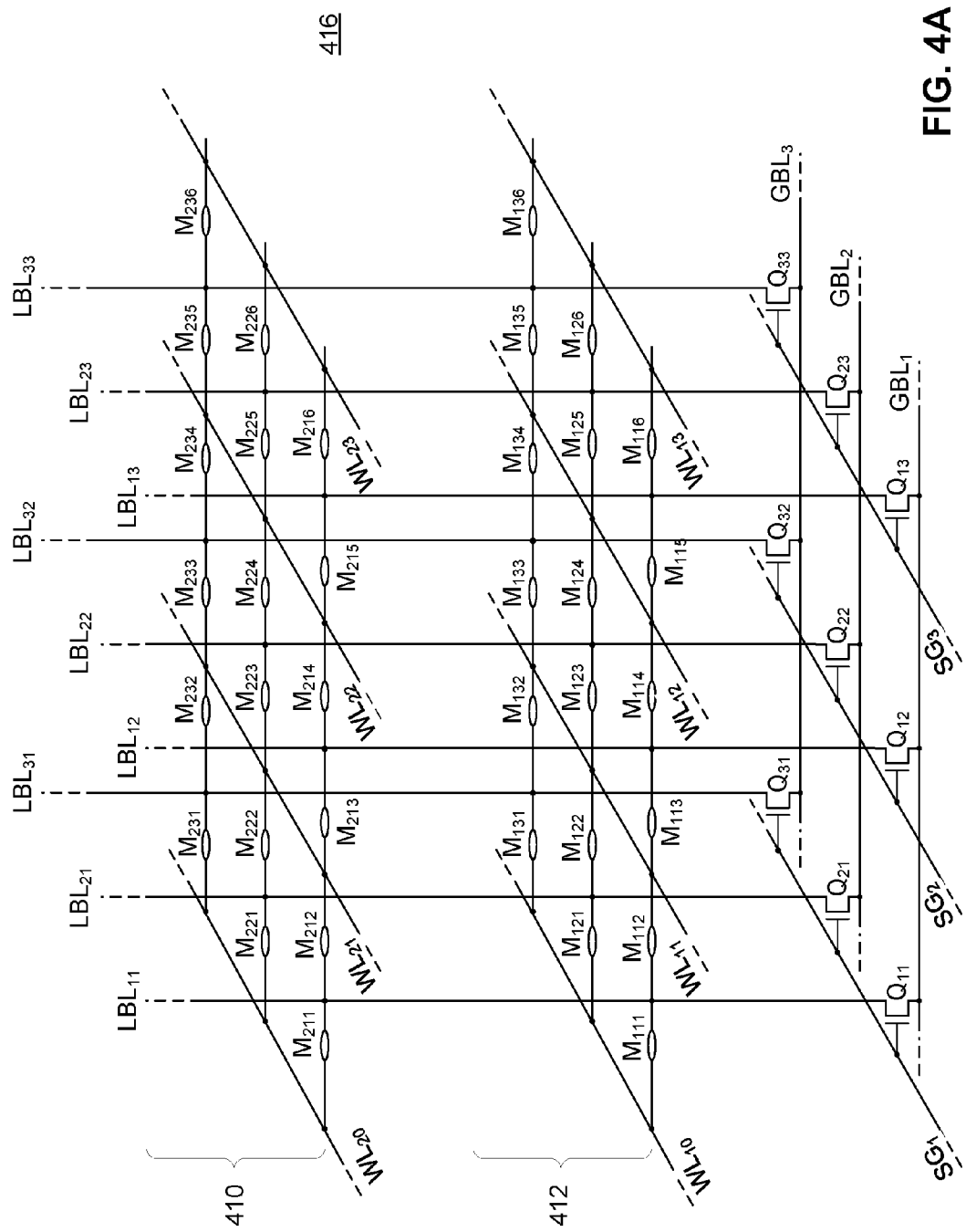
FIGS. 4A-4B depict various embodiments of a portion of a three-dimensional memory array.

FIG. 4A depicts one embodiment of a portion of a monolithic three-dimensional memory array 416 that includes a first memory level 412 positioned below a second memory level 410. Memory array 416 is one example of an implementation for memory array 301 in FIG. 1E. The local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). The memory cells are reversible-resistance memory cells, in one embodiment. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 416, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 4B:
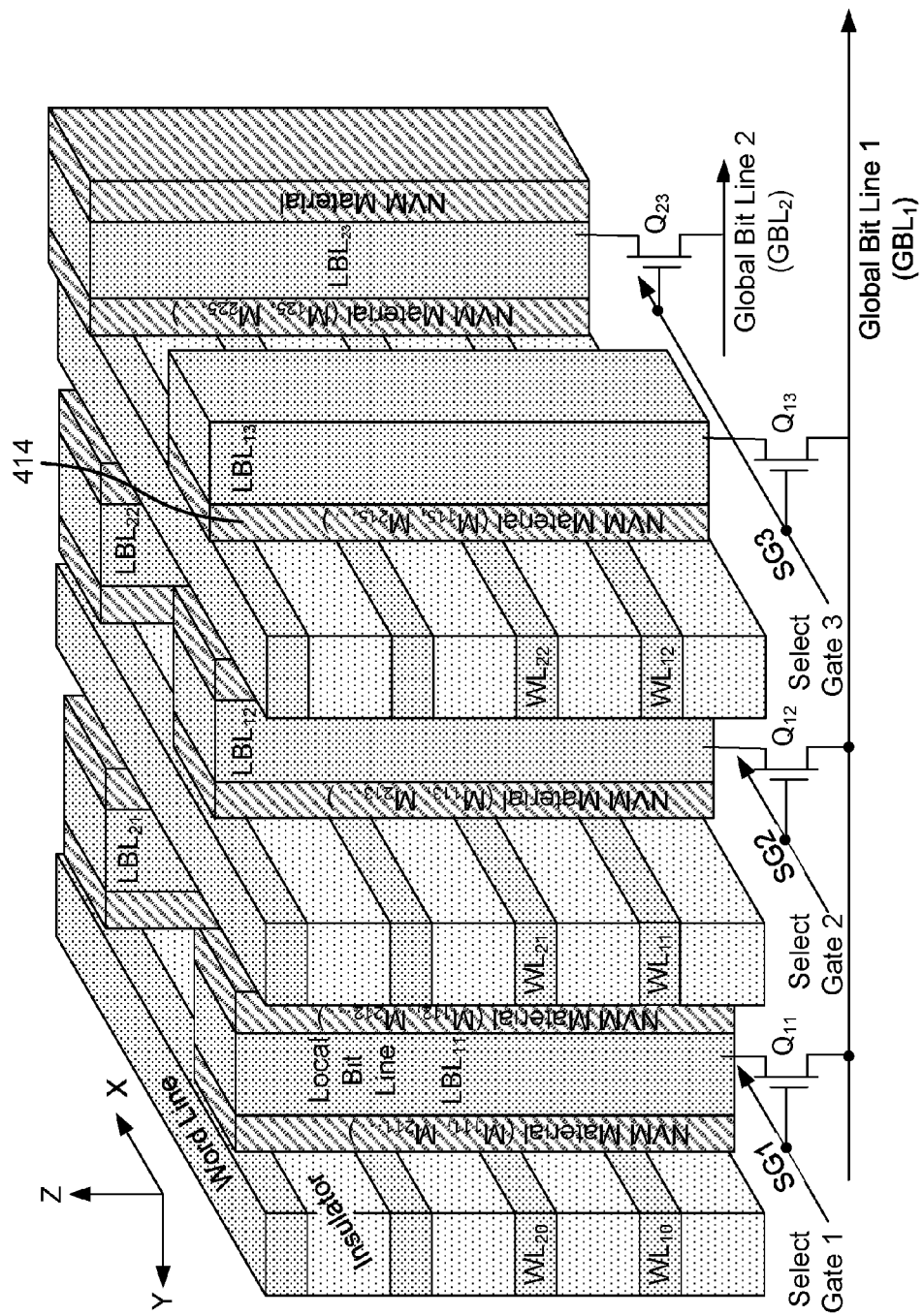

FIG. 4B depicts one embodiment of a portion of a monolithic three-dimensional memory array that includes vertical strips of a non-volatile memory material. The physical structure depicted in FIG. 4B may comprise one implementation for a portion of the monolithic three-dimensional memory array depicted in FIG. 4A. The vertical strips of non-volatile memory material may be formed in a direction that is perpendicular to a substrate (e.g., in the Z direction). A vertical strip of the non-volatile memory material 414 may include, for example, a vertical oxide layer, a vertical metal oxide layer (e.g., nickel oxide or hafnium oxide), a vertical layer of phase change material. The vertical strip of material may comprise a single continuous layer of material that may be used by a plurality of memory cells or devices. In one example, portions of the vertical strip of the non-volatile memory material 414 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical thin-film transistor (TFT).

Figure 5:
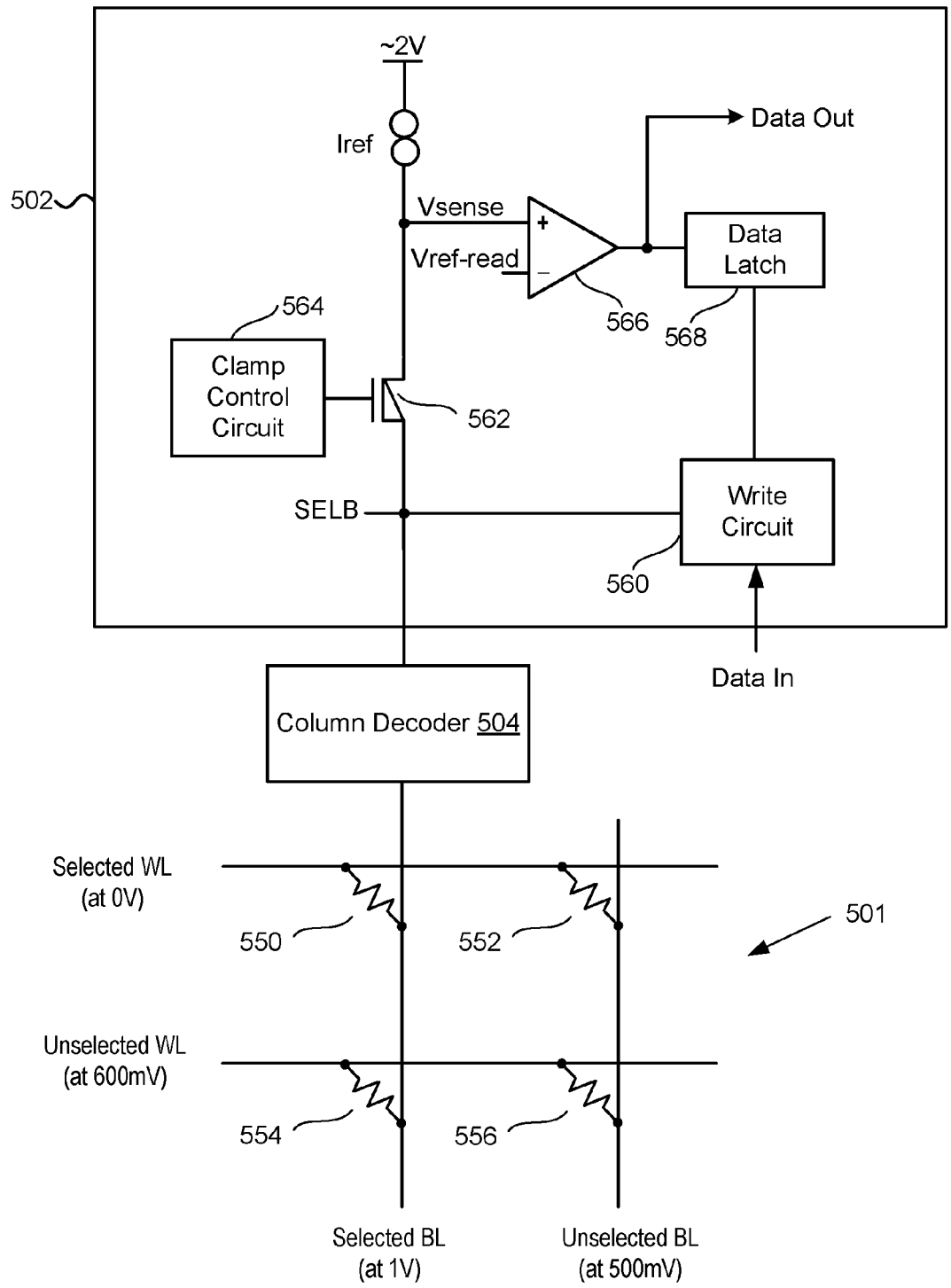
FIG. 5 depicts one embodiment of a read/write circuit.

FIG. 5 depicts one embodiment of a read/write circuit 502 along with a portion of a memory array 501. Read/write circuit 502 is one example of an implementation of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 2A. In another embodiment, the portion of a memory array 501 may comprise a memory array with bit lines arranged in a vertical direction that is perpendicular to the substrate, such as memory array 416 in FIG. 4A.

As depicted, during a memory array operation (e.g., a programming operation), the selected bit line may be biased to, for example, 1V, the unselected word line may be biased to, for example, 0.6V, the selected word line may be biased to, for example, 0V, and the unselected bit line may be biased to, for example, 0.5V. These voltages are for purpose of illustration. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 may be electrically coupled to the selected bit line via column decoder 504. In one embodiment, column decoder 504 may correspond with column decoder 302 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

Figure 6:
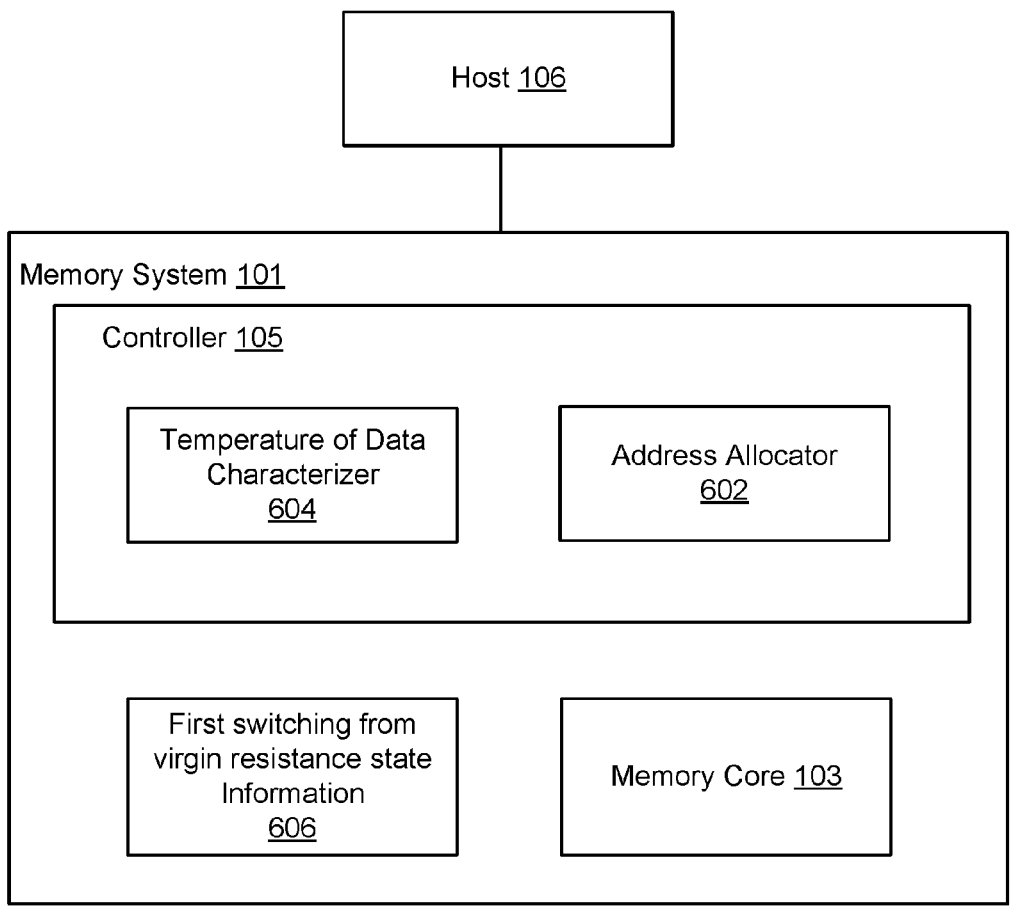
FIG. 6 is a diagram of one embodiment of a memory system.

FIG. 6 is a diagram of one embodiment of a memory system 101. The controller 105 has an address allocator 602, and a temperature of data characterizer 604. The address allocator 602 is configured to determine what memory cells should be used to store data from the host 106, in one embodiment. The host data could be data that has not yet been stored in the memory system 101 or host data that is to be moved within the memory system (e.g., wear leveling).

The temperature of data characterizer 604 is configured to characterize data from the host 106 based on a frequency of data access, in one embodiment. This frequency may be an actual frequency of past accesses, or an expected frequency of future accesses. The expected frequency may be based on past accesses, but is not limited to only considering past accesses. Herein, the term "frequency of access of a unit of data" or the like will be understood to include past frequency of access and/or expected future frequency of access. In one embodiment, a temperature is assigned to a unit of data based on frequency of access of the unit of data. In one embodiment, the write frequency is considered, but the read frequently is not considered. In one embodiment, the read frequency is considered, but the write frequency is not considered. In one embodiment, both the write frequency and the read frequency are considered. When considering both write and read frequency, a temperature could be assigned for frequency of write access and another temperature for frequency of read access. Alternatively, a single temperature could be assigned based on both the write and read frequency.

In one embodiment, characterizer 604 assigns a higher temperature to data having a higher frequency of access and a lower temperature to data having a lower frequency of access. In one embodiment, the data is characterized on a page by page basis. However, data could be characterized at larger or smaller granularity, such as a block by block basis or byte by byte basis. The units of data are not required to all be the same size. For example, some data may be characterized on a page by page basis and other data on a byte by byte basis. It is not required that every unit of data stored in the memory core 103 be characterized.

In one embodiment, the characterizer 604 characterizes various units of data into one of two temperatures. For example, data having a high frequency of access may be characterized as hot, and data having a low frequency of access may be characterized as cold. High frequency can be defined as higher than some threshold frequency, while low frequency can be defined as lower than another threshold frequency. Note that some data might not be accessed frequently enough to be considered hot, but also not be accessed so infrequently as to be considered cold. Thus, some data might not fit into either the hot or cold category. Note that the concept of data temperature does not require a precise degree be assigned to the data.

In one embodiment, the characterizer 604 characterizes various units of data into one of three temperatures, based on frequency of access. In one embodiment, the characterizer 604 characterizes various units of data into one of four temperatures, based on frequency of access. The data could be characterized into any number of temperatures. In each of these cases, there could be some data that does not fit into one of the temperature categories. However, one option is to assign a temperature to all data access frequencies. In one embodiment, the assignments can be made based a frequency ranges.

The first switching from virgin resistance state information 606 stores information regarding switching groups of the reversible-resistance memory cells in the memory core 103 from a virgin resistance state to a different resistance state for the first time. For memory cells that are in a high resistance state immediately after fabrication this information pertains to switching from a virgin high resistance state to a low resistance state for the first time after fabrication. For memory cells that are in a low resistance state immediately after fabrication this information pertains to switching from a virgin low resistance state to a high resistance state for the first time after fabrication. The size of the groups is at least one memory cell. In one embodiment, each group is a byte (e.g., eight) of reversible-resistivity memory cells. In one embodiment, each group is a page of reversible-resistivity memory cells. The group could be some other size.

In one embodiment, the information 606 describes how difficult it was to switch a group from a high resistance state to a low resistance state for the first time after fabrication. In one embodiment, each group of memory cells is placed into one or two or more "bins". For example, there may be two bins, three bins, four bins, or more than four bins.

In one embodiment, the reversible-resistance memory cells in the memory core 103 are in a high resistance state after fabrication. For such memory cells, a forming operation may be performed to switch them from a high resistance state to a low resistance state for the first time. The information 606 may be based on how difficult it was to form a group of reversible-resistance memory cells. For example, the information 606 may be based on how many iterations of a multi-iteration forming process were needed for memory cells in the group to pass the forming process. The information 606 may be based on another factor, such as a magnitude of a current limit at which the forming operation passed. Note that the information 606 could be an average (e.g., mean, median, or mode) for the individual cells in the group.

In one embodiment, the reversible-resistance memory cells in the memory core 103 are in a low resistance state after fabrication. For such memory cells, an initialization operation might be used to switch them from a virgin low resistance state to a high resistance state for the first time. Herein, this is referred to as an "initialization" operation. The information 606 may be based on how difficult it was to initialize a group of reversible-resistivity memory cells. For example, the information 606 may be based on how many iterations of a multi-iteration initialization process were needed for memory cells in the group to pass the initialization process.

Note that the information 606 may provide an indication of expected data retention of the various groups of reversible-resistivity memory cells in the core 103. Data retention refers to how long a group of non-volatile memory cells is able to retain data in an unpowered state.

The information 606 may provide an indication of expected endurance of the various groups of reversible-resistivity memory cells in the core 103. Endurance refers to the ability to meet some quality standard in view of some amount of use and/or time. Endurance is sometimes specified in how many times the memory cells can be accessed, and still be expected to meet certain standards (such as data retention). For example, endurance could be specified as some number of write accesses.

The information 606 may be stored in non-volatile storage anywhere on the memory system 101. For example, some of the reversible-resistivity memory cells in the core 103 could be used to store the information. The information 606 may be stored within the controller 105. In one embodiment, information 606 is stored in ROM in the controller 105. In one embodiment, information 606 is stored in ROM (e.g., ROM 218, FIG. 1I) within the memory system 101, but external to the controller 105.

The address allocator 602 may be configured to determine a physical address of memory cells in the core 103 in which to store data from the host 106. In one embodiment, the address allocator 602 is configured to map a logical address of the data from the host to a physical address of reversible-resistivity memory cells in the core 130.

The address allocator 602 is configured to select a group of reversible-resistivity memory cells in the core 130 to store data from the host 106 based on the information 606, in one embodiment. For example, the address allocator 602 may select a group of memory cells for which the endurance and/or data retention is expected to be relatively high for one unit of data and a group of memory cells for which the endurance and/or data retention is expected to be relatively low for another unit of data.

In one embodiment, the address allocator 602 factors in the temperature of the data when selecting a group of reversible-resistivity memory cells in the core 130 to store data from the host 106. For example, the address allocator 602 could store hot data in a group of memory cells that are expected to have higher endurance and/or data retention and colder data in a group of memory cells that are expected to have lower endurance and/or data retention.

In one embodiment, the temperature of data characterizer 604 and the address allocator 602 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each module 602, 604 may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module 602, 604 may include or comprise software stored in a processor readable device (e.g., memory) to program a one or more processors to perform the functions of the temperature of data characterizer 604 and the address allocator 602.

FIG. 7 is a flowchart of one embodiment of a process 700 of selecting a group of reversible-resistance memory cells in which to store a unit of data. In one embodiment, the reversible-resistance memory cells are of a type that have a high resistance in a "virgin" state after fabrication and undergo a forming operation. In one embodiment, the reversible-resistance memory cells are of a type that have a low resistance in a "virgin" state after fabrication and undergo an initialization operation.

Process 700 will be discussed with reference to the memory system 101 of FIG. 6, but is not limited thereto. The process 700 could be performed in response to store a unit of data in the memory core 103. However, another option is for the process 700 to be performed as part of a wear-leveling algorithm. Thus, it is not required that the process 700 be triggered by a request from the host to write a unit of data to the memory core 103.

Step 702 includes accessing information 606 regarding switching groups of reversible-resistance memory cells from a virgin resistance state to a target resistance state for the first time. In one embodiment, the information 606 is based on a difficulty in switching groups of the reversible-resistance memory cells from a virgin high resistance state to a low resistance state for the first time. In one embodiment, the information 606 is based on a difficulty in forming groups of the reversible-resistance memory cells after fabrication. In one embodiment, the information 606 is based on a difficulty in switching groups of the reversible-resistance memory cells from a virgin low resistance state to a high resistance state for the first time. In one embodiment, the information 606 is based on a difficulty in initializing groups of the reversible-resistance memory cells after fabrication. In one embodiment, the information 606 is based on the number of iterations of a multi-iteration forming process. In one embodiment, the information 606 is based on the number of iterations of a multi-iteration initialization process.

Step 704 includes selecting a group of reversible-resistance memory cells in which to store a unit of data. The selection may be based on the information from step 702. In one embodiment, step 704 includes performing logical to physical mapping of data to the reversible-resistance memory cells. In one embodiment, step 704 includes performing wear-leveling of the reversible-resistance memory cells based on the information.

Step 706 includes storing the unit of data in the selected reversible-resistivity memory cells.

FIG. 8 is a flowchart of one embodiment of a process 800 of selecting a group of reversible-resistivity memory cells in which to store a unit of data. Process 800 may be similar to process 700, but adds in the factor of data temperature to selected memory cells. In one embodiment, the reversible-resistivity memory cells are of a type that have a high resistance in a "virgin" state after fabrication and undergo a forming event. In one embodiment, the reversible-resistivity memory cells are of a type that have a low resistance in a "virgin" state after fabrication and undergo an initialization event.

Process 800 will be discussed with reference to the memory system 101 of FIG. 6, but is not limited thereto. The process 800 could be performed in response to store a unit of data in the memory core 103. However, another option is for the process 800 to be performed as part of a wear-leveling algorithm. Thus, it is not required that the process 800 be triggered by a request from the host to write a unit of data to the memory core 103.

Step 802 includes accessing a temperature of a unit of data to be stored in the memory core 103. The temperature may be based on the frequency of data access. The temperature may be one of two temperatures, one of three temperatures, one of four temperatures, etc.

Step 804 includes accessing information 606 regarding switching groups of reversible-resistivity memory cells from a virgin resistance state to a different resistance state for the first time. Step 804 may use information similar to step 702.

Step 806 includes selecting a group of reversible-resistivity memory cells in which to store a unit of data. The selection may be based on both the temperature and the information 606 regarding switching groups of reversible-resistivity memory cells from a virgin resistance state to a different resistance state for the first time after fabrication. FIGS. 11A-11E provide several examples of selecting based on both the temperature and the information 606 regarding switching groups of reversible-resistivity memory cells from a virgin resistance state to a different resistance state for the first time after fabrication. Step 806 is not limited to those examples.

Step 808 includes storing the unit of data in the selected reversible-resistivity memory cells.

Figure 9A:
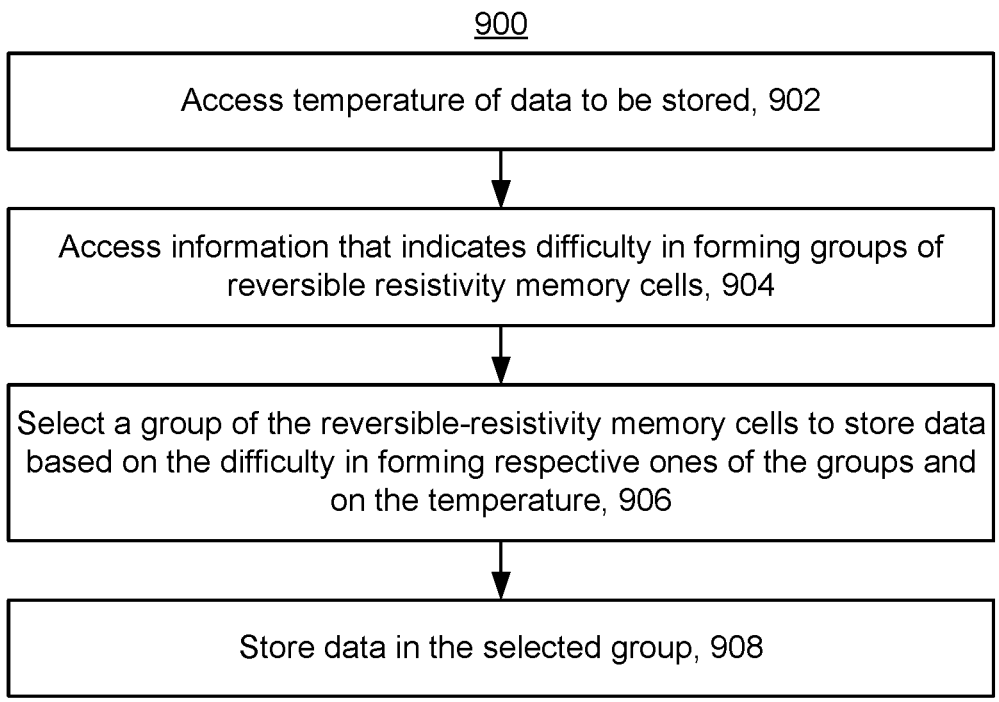
FIG. 9A is a flowchart of one embodiment of a process of selecting a group of reversible-resistance memory cells in which to store a unit of data based on forming difficulty.

FIG. 9A is a flowchart of one embodiment of a process 900 of selecting a group of reversible-resistivity memory cells in which to store a unit of data. In process 900, the reversible-resistivity memory cells are of a type that have a high resistance in a "virgin" state after fabrication and undergo a forming event. Process 900 is one embodiment of process 800.

Step 902 includes accessing a temperature of a unit of data to be stored in the memory core 103. The temperature may be based on the frequency of data access. Step 902 may be similar to step 802.

Step 904 includes accessing information 606 that indicates a difficulty in forming various groups of the reversible-resistivity memory cells. In one embodiment, the information 606 is based on the number of iterations of a multi-iteration forming process. Note that this information may be based on an average for various memory cells in the group. For example, the average (e.g., mean, median, mode) number of iterations of a multi-iteration forming process used for individual cells in the group may be used to characterize each group.

Step 906 includes selecting a group of reversible-resistivity memory cells in which to store a unit of data. The selection may be based on both the temperature and the information that indicates a difficulty in forming various groups of the reversible-resistivity memory cells. FIGS. 11A-11E provide several examples that can be used to select memory cells based on both the temperature and information regarding difficulty in forming various groups of the reversible-resistivity memory cells. Step 906 is not limited to those examples.

Step 908 includes storing the unit of data in the selected reversible-resistivity memory cells.

Figure 9B:
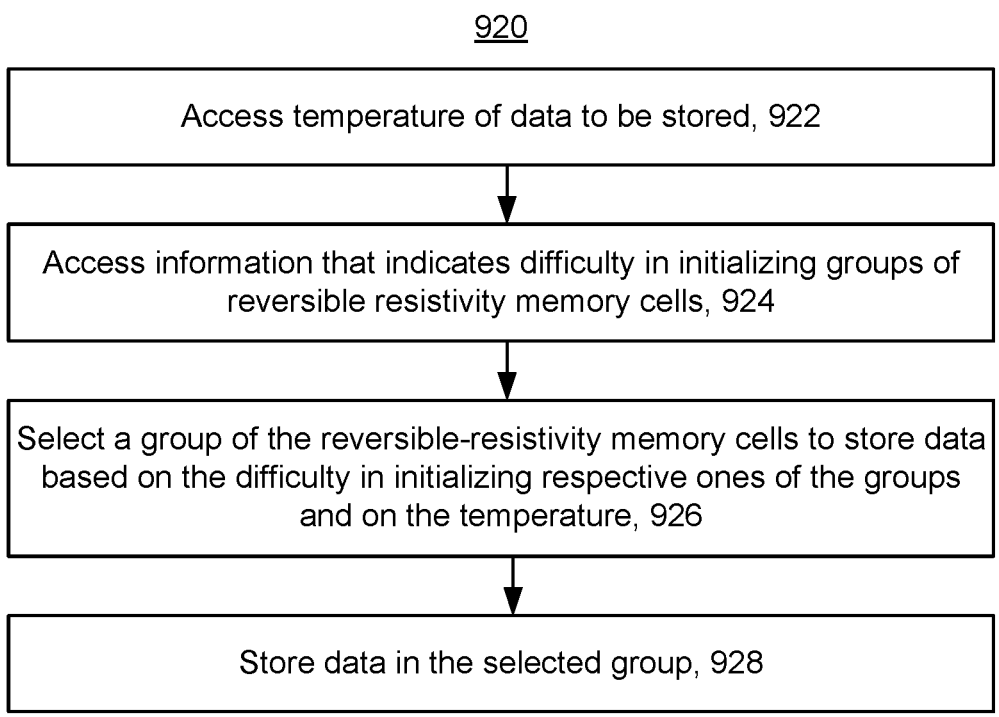
FIG. 9B is a flowchart of one embodiment of a process of selecting a group of reversible-resistance memory cells in which to store a unit of data based on initialization difficulty.

FIG. 9B is a flowchart of one embodiment of a process 920 of selecting a group of reversible-resistivity memory cells in which to store a unit of data. In process 920, the reversible-resistivity memory cells are of a type that have a low resistance in a "virgin" state after fabrication and undergo an initialization event. Process 920 is one embodiment of process 800.

Step 922 includes accessing a temperature of a unit of data to be stored in the memory core 103. The temperature may be based on the frequency of data access. Step 922 may be similar to step 802.

Step 924 includes accessing information 606 that indicates a difficulty in initializing various groups of the reversible-resistivity memory cells. In one embodiment, the information 606 is based on the number of iterations of a multi-iteration initialization process. Note that this information may be based on an average for various memory cells in the group. For example, the average (e.g., mean, median, mode) number of iterations of a multi-iteration initialization process used for individual cells in the group may be used to characterize each group.

Step 926 includes selecting a group of reversible-resistivity memory cells in which to store a unit of data. The selection may be based on both the temperature and the information that indicates a difficulty in initializing various groups of the reversible-resistivity memory cells. FIGS. 11A-11E provide several examples that can be used to select memory cells based on both the temperature and information regarding difficulty in forming various groups of the reversible-resistivity memory cells. Step 926 is not limited to those examples.

Step 928 includes storing the unit of data in the selected reversible-resistivity memory cells.

Figure 10A:
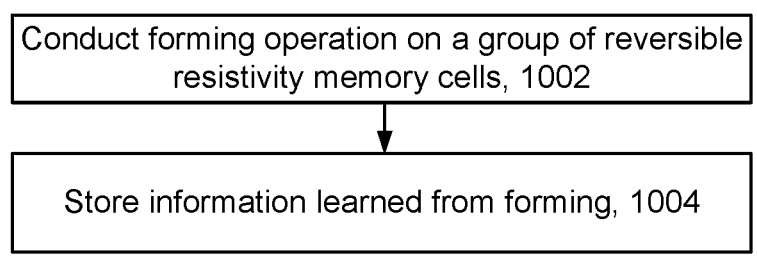
FIG. 10A is a flowchart of one embodiment of a process of storing information regarding forming groups of the reversible-resistance memory cells.

FIG. 10A is a flowchart of one embodiment of a process 1000 of storing information regarding switching groups of the reversible-resistivity memory cells from a high resistance state to a low resistance state for the first time. In process 1000, the reversible-resistivity memory cells are of a type that have a high resistance in a "virgin" state after fabrication and undergo a forming event.

Step 1002 includes conducting a forming operation on a group of memory cells. The group may be of any size. Step 1002 may include applying a signal to individual reversible-resistance memory cells in the group, and then testing individual reversible-resistance memory cells in the group to determine whether the resistance of an individual reversible-resistance memory cell has been lowered to a target resistance. The signal may include one or more of a voltage, current, temperature, but is not limited thereto. Step 1002 may include multiple iterations of applying the signal and testing the resistance.

Step 1004 includes storing information learned from the forming operation. In one embodiment, the information is based on how many iterations of a multi-iteration forming process were needed to reduce the resistance to a target resistance. If there is more than one memory cell in the group, the average (e.g., mean, median, or mode) number of iterations for cells in the group may be used to represent the difficulty in forming the group of memory cells.

In one embodiment, step 1004 includes placing the group into one of two or more bins. Each bin represents a specific range of iterations of the multi-iteration forming process, in one embodiment.

Figure 10B:
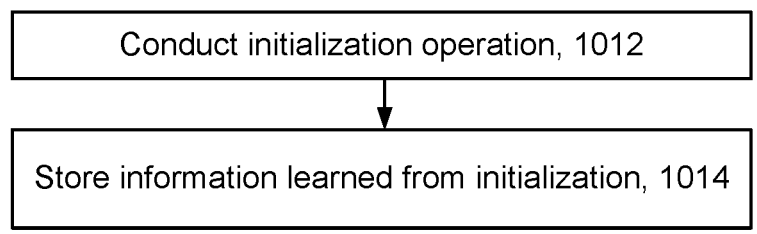
FIG. 10B is a flowchart of one embodiment of a process of storing information regarding initializing groups of the reversible-resistance memory cells.

FIG. 10B is a flowchart of one embodiment of a process 1010 of storing information regarding switching groups of the reversible-resistance memory cells from a high resistance state to a low resistance state for the first time. In process 1010, the reversible-resistance memory cells are of a type that have a low resistance in a "virgin" state after fabrication and undergo an initialization event.

Step 1012 includes conducting an initialization operation on a group of memory cells. The group may be of any size. Step 1012 may include applying a signal to individual reversible-resistance memory cells in the group, and then testing individual reversible-resistance memory cells in the group to determine whether the resistance of an individual reversible-resistance memory cell has been increased to a target resistance. The signal may include one or more of a voltage, current, temperature, but is not limited thereto. Step 1012 may include multiple iterations of applying the signal and testing the resistance.

Step 1014 includes storing information learned from the initialization operation. In one embodiment, the information is based on how many iterations of a multi-iteration initialization process were needed to increase the resistance to a target resistance. If there is more than one memory cell in the group, the average (e.g., mean, median, or mode) number of iterations for cells in the group may be used to represent the difficulty in initializes the group of memory cells.

In one embodiment, step 1014 includes placing the group into one of two or more bins. Each bin represents a specific range of iterations of the multi-iteration initialization process, in one embodiment.

Figure 10C:
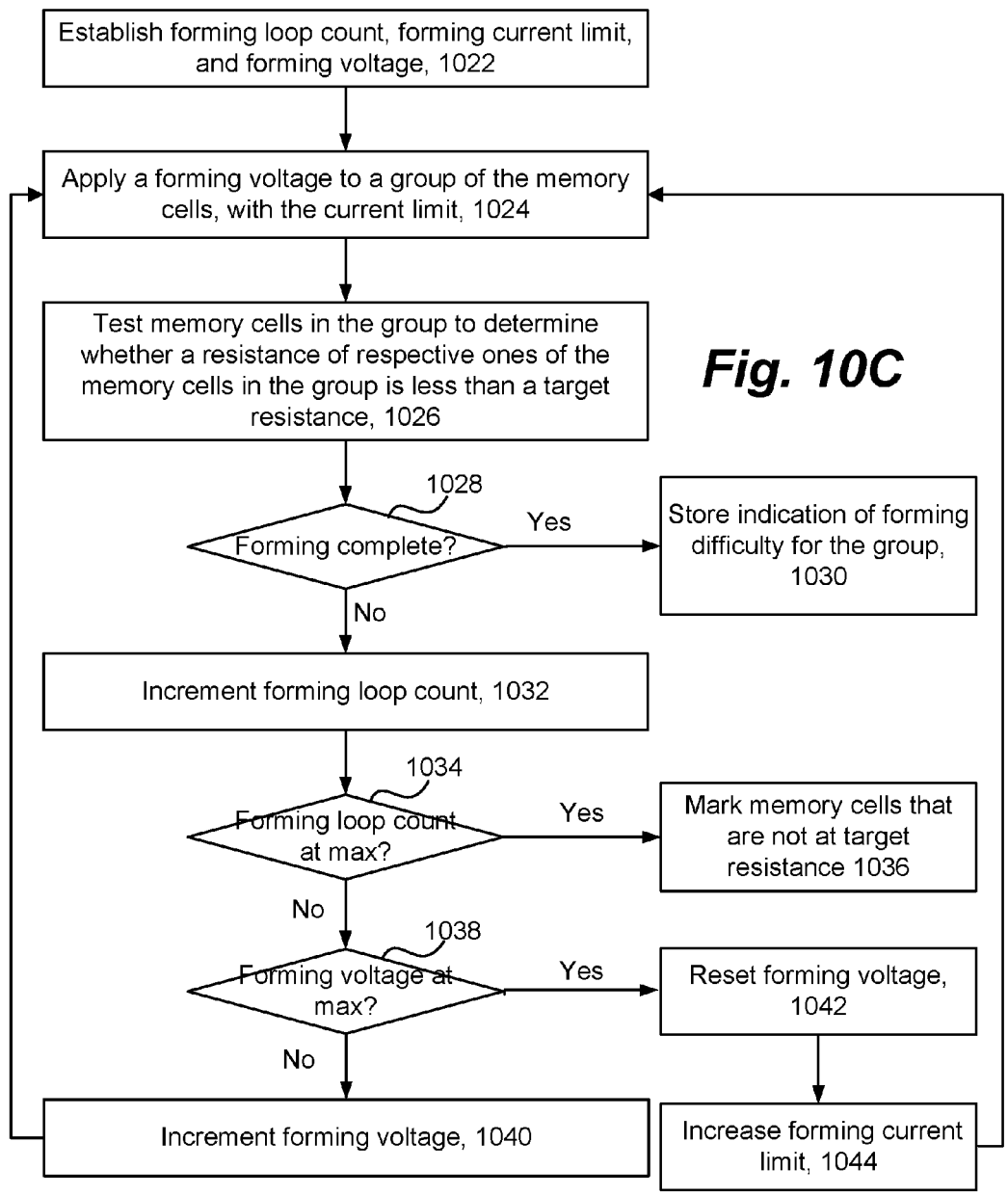
FIG. 10C is a flowchart of one embodiment of a forming process.

FIG. 10C is a flowchart of one embodiment of a forming process 1020. Process 1020 is one example of a forming process that could be used in process 1000. However, process 1000 is not limited to process 1020. Step 1022 includes establishing a forming loop count, a forming loop current limit, and a forming voltage.

Step 1024 includes applying a forming voltage to individual reversible-resistivity memory cells while limiting a current allowed to flow through each reversible-resistivity memory cell.

Step 1026 includes testing the individual reversible-resistivity memory cells to determine whether their respective resistances is less than a target resistance. Note that any memory cell that passed the test may be noted such that when step 1024 is performed again, this memory cell need not receive the next forming voltage.

Step 1028 is a test of whether forming is complete for this group. Step 1028 may test whether each of the memory cells in the group passed the test of step 1026. If so, then in step 1030 an indication of how difficult it was to form this group is recorded in step 1030. The indication is based on the number of iterations of process 1020, in one embodiment. Step 1030 may calculate an average number of iterations for the group, and place the group into a bin based on the average (e.g., mean, median, or mode).

If there is at least one memory cell in the group that did not pass step 1026, then the process continues at step 1032. Step 1032 is to increment the forming loop count. Step 1034 is a test of whether the forming loop count is at a maximum allowed number of loops. If so, then step 1036 is performed. Step 1036 marks any memory cell that has not yet passed the test of step 1026. Such memory cells could be flagged as bad cells, which are not to be used. Alternatively, such memory cells might be reclaimed by further processing. For example, an alternative forming process might be applied to such memory cells. The cells in the group that did pass the forming operation could be characterized as in step 1030. In one embodiment, the group that is tested is of sufficient size such that even if some cells fail to pass the forming process, the group is still large enough to be usable. For example, the group that is tested could be larger than a page.

If the forming loop count is not yet at the maximum, the process continues at step 1038. Step 1038 is to test whether the magnitude of the forming voltage is at an allowed maximum. If not, then the magnitude of the forming voltage is incremented at step 1040. Then, the process returns to step 1024 to apply the forming voltage to at least some of the memory cells in the group. Memory cells that have passed step 1026 need not receive another forming voltage.

When the forming voltage reaches a maximum allowed magnitude (step 1038=yes), then the magnitude of the forming voltage is reset to the level at the start of process 1020. In step 1044 the current limit is increased. This allows the memory cells that have not yet passed the forming process to receive a higher current during the step 1024. The process then returns to step 1024.

Figure 10D:
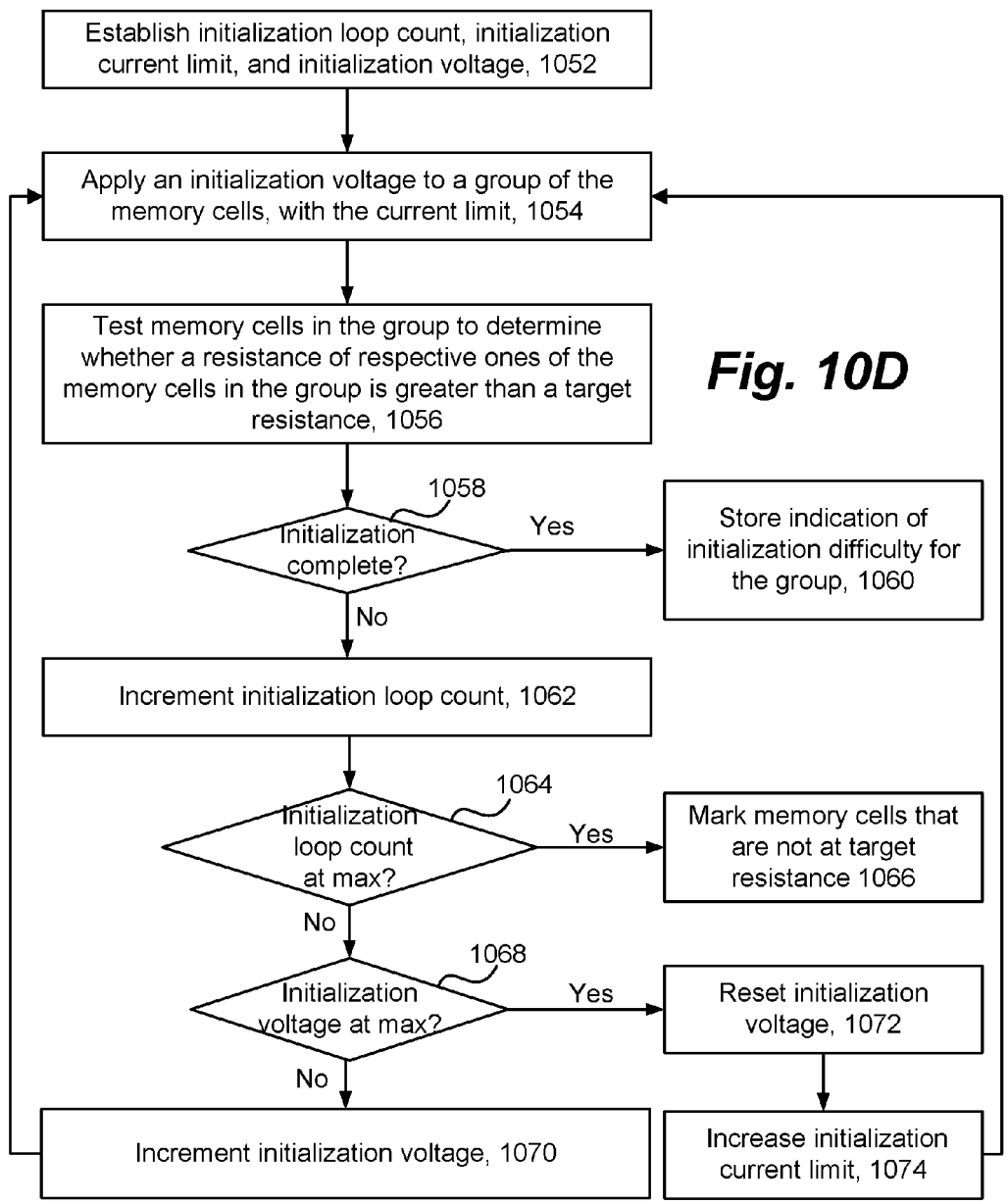
FIG. 10D is a flowchart of one embodiment of an initialization process.

FIG. 10D is a flowchart of one embodiment of an initialization process 1050. Process 1020 is one example of an initialization process that could be used in process 1010. However, process 1010 is not limited to process 1050. Step 1052 includes establishing an initialization loop count, an initialization loop current limit, and an initialization voltage.

Step 1054 includes applying an initialization voltage to individual reversible-resistivity memory cells while limiting a current allowed to flow through each reversible-resistivity memory cell.

Step 1056 includes testing the individual reversible-resistivity memory cells to determine whether their respective resistances is greater than a target resistance. Note that any memory cell that passed the test may be noted such that when step 1054 is performed again, this memory cell need not receive the next initialization voltage.

Step 1058 is a test of whether initialization is complete for this group. Step 1058 may test whether each of the memory cells in the group passed the test of step 1056. If so, then in step 1060 an indication of how difficult it was to initialize this group is recorded in step 1060. The indication is based on the number of iterations of process 1050, in one embodiment. Step 1060 may calculate an average number of iterations for the group, and place the group into a bin based on the average (e.g., mean, median, or mode).

If there is at least one memory cell in the group that did not pass step 1056, then the process continues at step 1062. Step 1062 is to increment the initialization loop count. Step 1064 is a test of whether the initialization loop count is at a maximum allowed number of loops. If so, then step 1066 is performed. Step 1066 marks any memory cell that has not yet passed the test of step 1056. Such memory cells could be flagged as bad cells, which are not to be used. Alternatively, such memory cells might be reclaimed by further processing. For example, an alternative initialization process might be applied to such memory cells. The cells in the group that did pass the initialization operation could be characterized as in step 1060. In one embodiment, the group that is tested is of sufficient size such that even if some cells fail to pass the initialization process, the group is still large enough to be usable. For example, the group that is tested could be larger than a page.

If the initialization loop count is not yet at the maximum, the process continues at step 1068. Step 1068 is to test whether the magnitude of the initialization voltage is at an allowed maximum. If not, then the magnitude of the initialization voltage is incremented at step 1070. Then, the process returns to step 1074 to apply the initialization voltage to at least some of the memory cells in the group. Memory cells that have passed step 1056 need not receive another initialization voltage.

When the initialization voltage reaches a maximum allowed magnitude (step 1068=yes), then the magnitude of the initialization voltage is reset to the level at the start of process 1050. In step 1074 the current limit is increased. This allows the memory cells that have not yet passed the initialization process to receive a higher current during the step 1054. The process then returns to step 1054.

FIGS. 11A-11E describe various embodiments of selecting a group of reversible-resistance memory cells in which to store data based on both the difficulty in switching from a virgin resistance state to a different resistance state for the first time after fabrication and a temperature of the data to be stored. Each of the processes include one embodiment of step 806, 906 or 926.

Figure 11A:
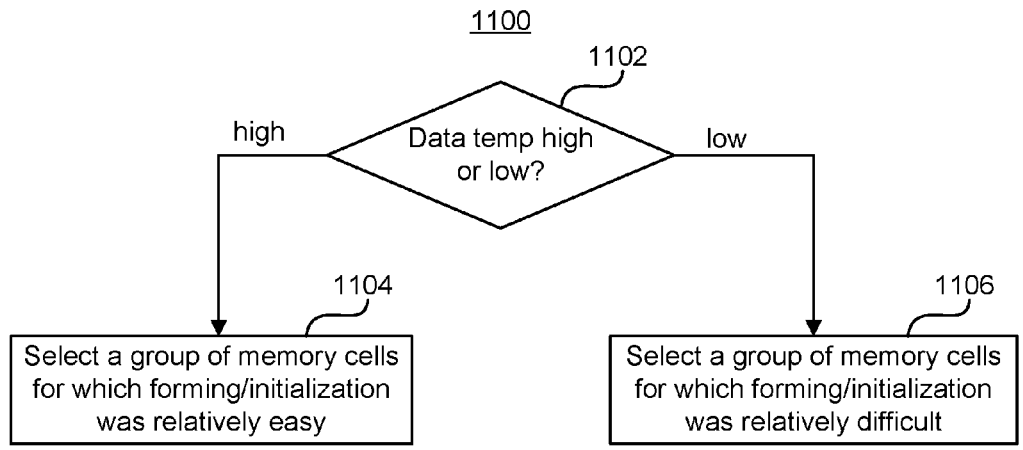
FIGS. 11A-11E describe various embodiments of selecting a group of reversible-resistance memory cells in which to store data based on both the difficulty in switching from a virgin resistance state to a different resistance state for the first time and a temperature of the data to be stored.

Process 1100 of FIG. 11A involves two data temperatures and two categories of difficulty of forming or initializing reversible-resistivity memory cells. Note that it is not required that all memory cells fall into one of the two categories, but that is one option. Likewise, it is not required that all data fall into one of two temperatures, but that is one option. Step 1102 includes determining whether the data temperature is low or high (e.g., cold or hot). If the data temperature is high, then a group of reversible-resistivity memory cells for which forming or initialization was relatively easy is selected in step 1104. If the data temperature is low, then a group of reversible-resistance memory cells for which forming or initialization was relatively difficult is selected in step 1106. In one embodiment, the difficulty in forming or initializing is based on the number of iterations of a forming or initialization operation used to switch the resistance from high to low. Thus, relatively easy may be defined as fewer than a threshold number of iterations. Relatively difficult may be defined as greater than a threshold number of iterations.

Note that for some reversible-resistance memory cells when forming or initialization is relatively easy, this may correlate with higher endurance and/or higher data retention. Conversely, when forming or initialization is relatively difficult, this may correlate with lower endurance and/or lower data retention. Hence, process 1100 may select higher endurance and/or higher data retention cells for data that has a higher access frequency. Conversely, process 1100 may select lower endurance and/or lower data retention cells for data that has a lower access frequency.

Figure 11B:
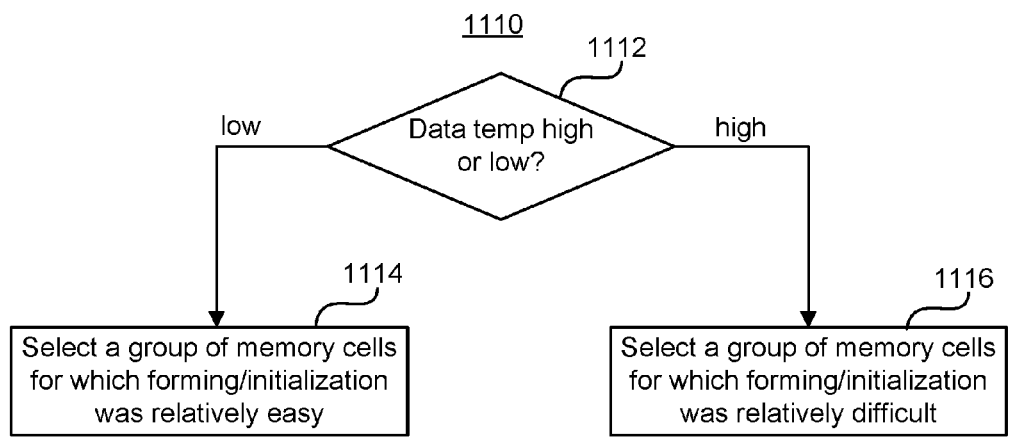

Process 1110 of FIG. 11B also involves two data temperatures and two categories of difficulty of forming or initializing reversible-resistivity memory cells. Note that it is not required that all memory cells fall into one of the two categories, but that is one option. Likewise, it is not required that all data fall into one of two temperatures, but that is one option. Step 1112 includes determining whether the data temperature is low or high. If the data temperature is low, then a group of reversible-resistivity memory cells for which forming or initialization was relatively easy is selected in step 1114. If the data temperature is high, then a group of reversible-resistivity memory cells for which forming or initialization was relatively difficult is selected in step 1116. In one embodiment, the difficulty in forming is based on the number of iterations of a forming operation used to switch the resistance from high to low. In one embodiment, the difficulty in initializing is based on the number of iterations of an initialization operation used to switch the resistance from low to high. Thus, relatively easy may be defined as fewer than a threshold number of iterations. Relatively difficult may be defined as greater than a threshold number of iterations.

Note that for some reversible-resistance memory cells when forming or initialization is relatively easy, this may correlate with lower endurance and/or lower data retention. Conversely, when forming or initialization is relatively difficult, this may correlate with higher endurance and/or higher data retention. Hence, process 1110 may select lower endurance and/or lower data retention cells for data that has a lower access frequency. Conversely, process 1100 may select higher endurance and/or higher data retention cells for data that has a higher access frequency.

Figure 11C:
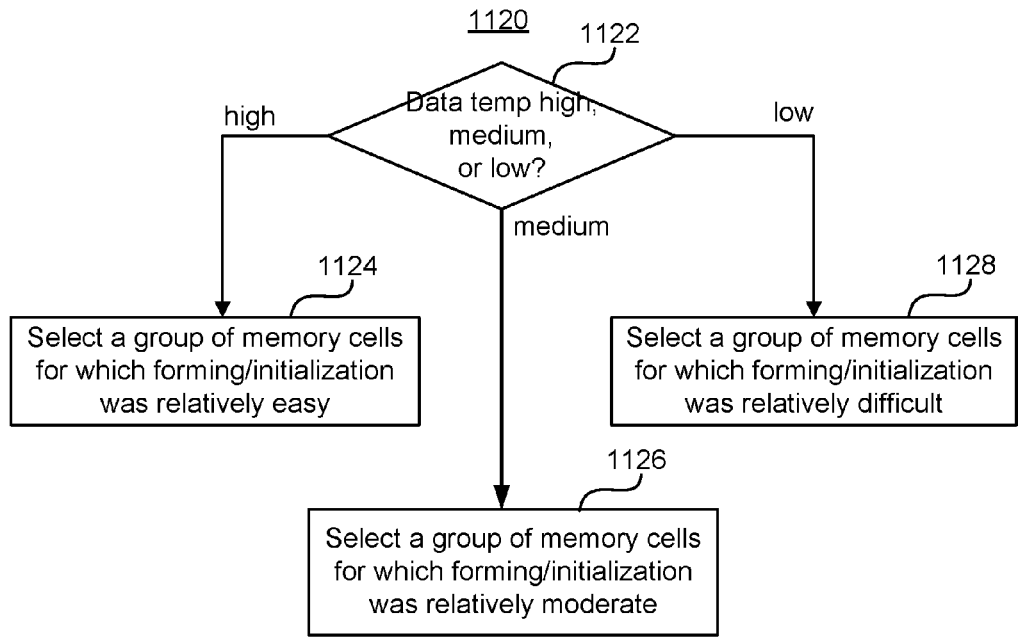

Process 1120 of FIG. 11C involves three data temperatures and three categories of difficulty of forming or initializing reversible-resistivity memory cells. Note that it is not required that all memory cells fall into one of the three categories, but that is one option. Likewise, it is not required that all data fall into one of three temperatures, but that is one option.

Step 1122 includes determining whether the data temperature is high, medium, or low. If the data temperature is high, then a group of reversible-resistivity memory cells for which forming or initialization was relatively easy is selected in step 1124. If the data temperature is medium, then a group of reversible-resistivity memory cells for which forming or initialization was relatively moderate is selected in step 1126. If the data temperature is low, then a group of reversible-resistivity memory cells for which forming or initialization was relatively difficult is selected in step 1128.

In one embodiment, the difficulty in forming or initializing is based on the number of iterations of a forming or initialization operation used to switch the resistance from a virgin resistance to a target resistance. Thus, relatively easy may be defined as fewer than a first threshold number of iterations. Relatively difficult may be defined as greater than a second threshold number of iterations. Relatively moderate may be defined as some range of iterations between the first and second thresholds.

Note that for some reversible-resistance memory cells when forming or initialization is relatively difficult, this may correlate with lower endurance and/or lower data retention. Conversely, when forming or initialization is relatively easy, this may correlate with higher endurance and/or higher data retention. When forming or initialization is relatively moderate, this may correlate with endurance and/or data retention between the lower and higher endurance memory cells.

Hence, process 1120 may select lower endurance and/or lower data retention cells for data that has a lower access frequency. Conversely, process 1120 may select higher endurance and/or higher data retention cells for data that has a higher access frequency. Process 1120 may select medium endurance and/or data retention memory cells for data having a medium access frequency.

Figure 11D:
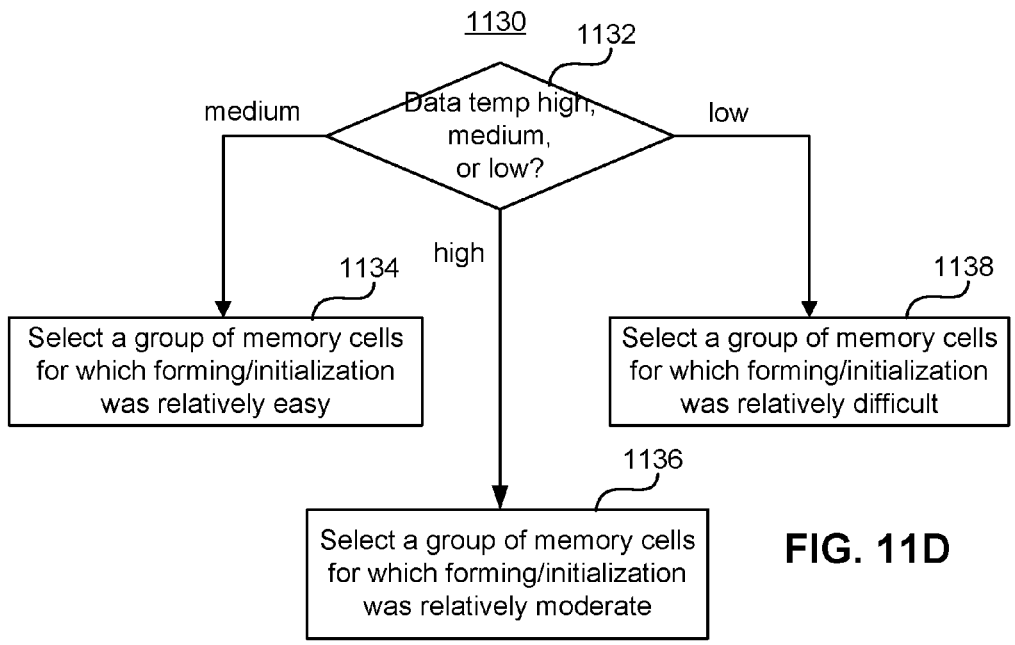

Process 1130 of FIG. 11D also involves three data temperatures and three categories of difficulty of forming or initializing reversible-resistivity memory cells. Note that it is not required that all memory cells fall into one of the three categories, but that is one option. Likewise, it is not required that all data fall into one of three temperatures, but that is one option.

Step 1132 includes determining whether the data temperature is high, medium, or low. If the data temperature is medium, then a group of reversible-resistivity memory cells for which forming or initialization was relatively easy is selected in step 1134. If the data temperature is high, then a group of reversible-resistivity memory cells for which forming or initialization was relatively moderate is selected in step 1136. If the data temperature is low, then a group of reversible-resistivity memory cells for which forming or initialization was relatively difficult is selected in step 1138.

Note that for some reversible-resistance memory cells when forming or initialization is relatively easy, this may correlate with medium endurance and/or medium data retention. Conversely, when forming or initialization is relatively difficult, this may correlate with lower endurance and/or lower data retention. When forming or initialization is relatively medium, this may correlate with higher endurance and/or higher data retention.

Hence, process 1130 may select lower endurance and/or lower data retention cells for data that has a lower access frequency. Process 1130 may select higher endurance and/or higher data retention cells for data that has a higher access frequency. Process 1130 may select medium endurance and/or data retention memory cells for data having a medium access frequency.

Figure 11E:
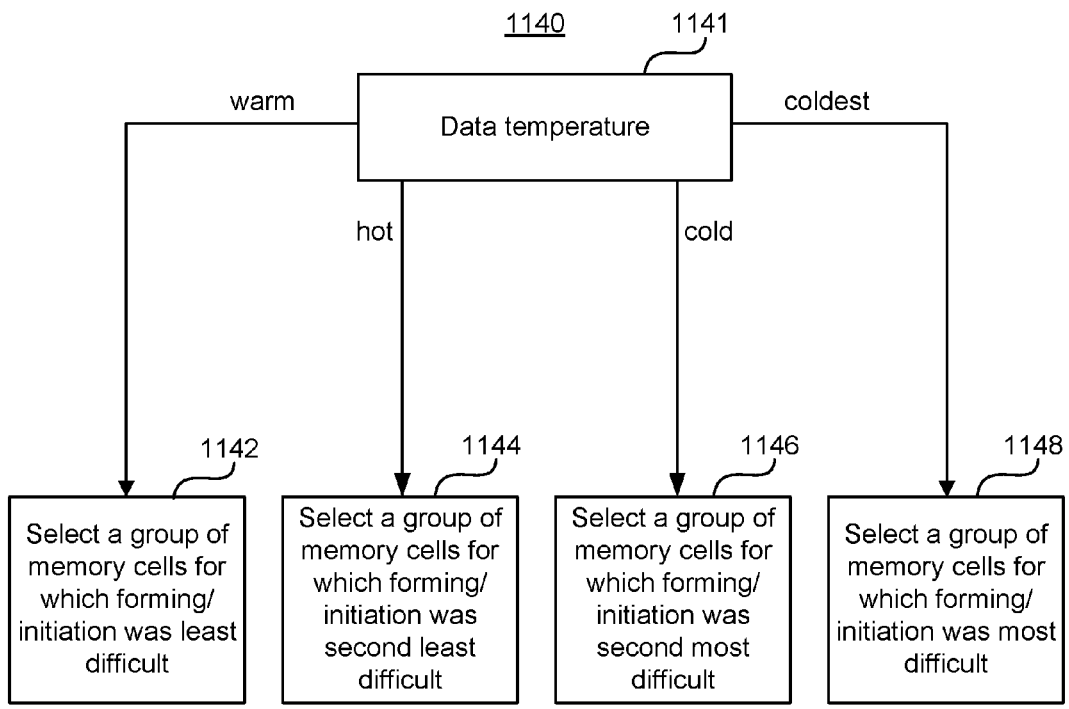

Process 1140 of FIG. 11E involves four data temperatures and four categories of difficulty of forming or initializing reversible-resistivity memory cells. Step 1141 includes determining whether the data temperature is hot, warm, cold, or coldest. If the data temperature is warm, then a group of reversible-resistivity memory cells for which forming or initialization was the least difficult is selected in step 1142. If the data temperature is hot, then a group of reversible-resistivity memory cells for which forming or initialization was the second least difficult is selected in step 1144. If the data temperature is cold, then a group of reversible-resistivity memory cells for which forming or initialization was the second most difficult is selected in step 1146. If the data temperature is coldest, then a group of reversible-resistivity memory cells for which forming or initialization was the most difficult is selected in step 1148.

Figure 11F:
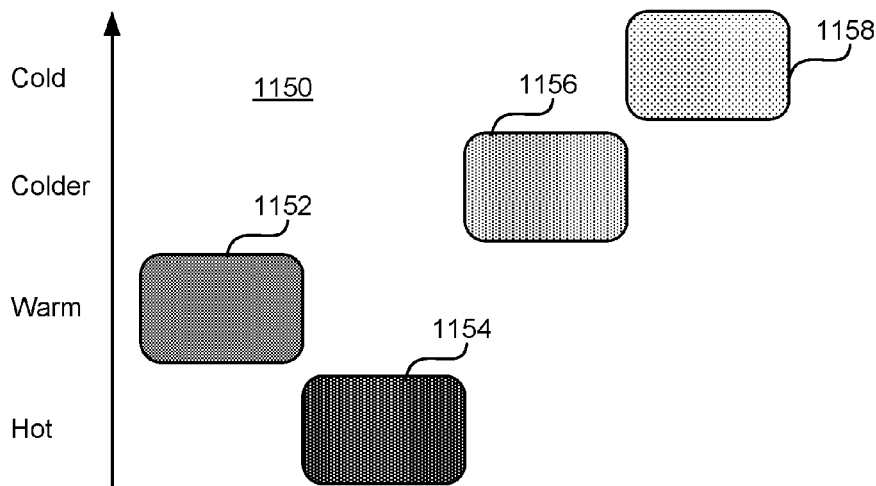
FIG. 11F is diagram that graphically illustrates categories used in one embodiment of the process of FIG. 11E.

FIG. 11F is diagram that graphically illustrates the categories used in one embodiment of the process 1140 of FIG. 11E. Temperature of the data is represented on the vertical axis. The temperature may be based on the number of host writes. For example, hot data corresponds to the most host writes and coldest data corresponds to the fewest host writes. The difficulty in forming or initialization is represented on the horizontal axis. In this example, there are four "bins". Bin 1152 corresponds to groups for which forming or initialization was the least difficult. Bin 1154 corresponds to groups for which forming or initialization was the second least difficult. Bin 1156 corresponds to groups for which forming or initialization was the second most difficult. Bin 1158 corresponds to groups for which forming or initialization was the most difficult.

The cells in bin 1154 are those with the highest expected endurance and/or data retention, in one embodiment. The cells in bin 1152 are those with the second highest expected endurance and/or data retention, in one embodiment. The cells in bin 1156 are those with the third highest (or second lowest) expected endurance and/or data retention, in one embodiment. The cells in bin 1158 are those with the fourth highest (or lowest) expected endurance and/or data retention, in one embodiment. Thus, higher endurance and/or higher data retention cells may receive hotter data, whereas lower endurance and/or lower data retention cells may receive colder data.

Note that the embodiments of FIGS. 11A-11D could apply to the example of FIG. 11E, but are not limited thereto. For example, the temperatures "high" and "low" in FIG. 11A could correspond to "hot" and "colder", with steps 1104 selecting bin 1154 and step 1106 selecting bin 1156. As another example, the temperatures "high" and "low" in FIG. 11A could correspond to "hot" and "coldest", with steps 1104 selecting bin 1154 and step 1106 selecting bin 1158. As another example, the temperatures "high" and "low" in FIG. 11A could correspond to "warm" and "coldest", with steps 1104 selecting bin 1152 and step 1106 selecting bin 1158. Other possibilities exist for FIG. 11A. The temperatures "high" and "low" in FIG. 11B could correspond to "hot" and "warm", with steps 1114 selecting bin 1152 and step 1116 selecting bin 1154.

Note that in the embodiments of FIGS. 11A-11E one example of characterizing the relative difficulty in forming or initialization was iterations of a multi-iteration forming or initialization process. An alternative is to characterize the difficulty based on a parameter such a voltage, current, temperature, etc. when the forming or initialization is complete. Other possibilities exist for characterizing the relative difficulty in forming or initialization.

Figure 12A:
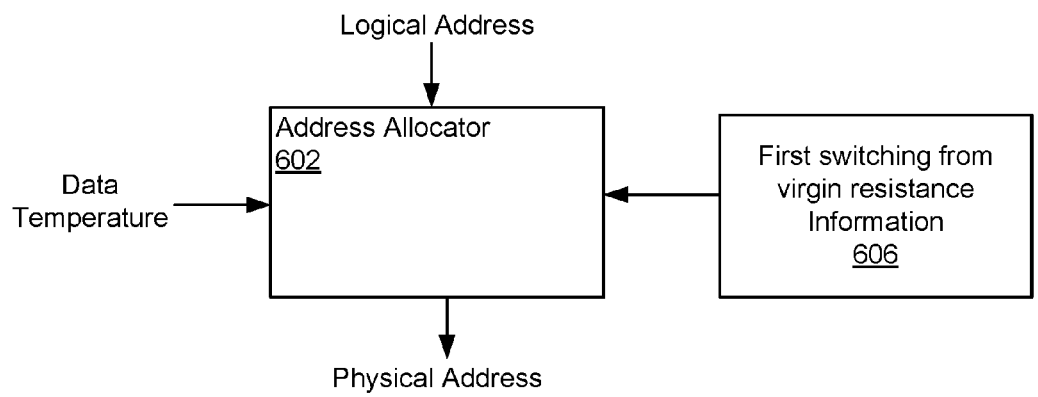
FIG. 12A is one embodiment of an address allocator.

FIG. 12A is one embodiment of the address allocator 602. The address allocator 602 inputs a logical address associated with a unit of data. The unit may be any size. In one embodiment, the unit of data is a page. In one embodiment, the unit of data is a byte. The address allocator 602 accesses a temperature of that unit of data. The temperature of data characterizer 604 may assign a temperature to that unit of data. Based on the temperature of data, the address allocator 602 selects a group of reversible-resistivity memory cells. To make this selection, the address allocator 602 accesses information 606. Recall that information 606 contains information regarding switching groups of reversible-resistivity memory cells from a virgin resistance state to a different state (e.g., target state) for the first time after fabrication. The various processes in FIGS. 11A-11E are some examples of how the address allocator 602 can select a group based on the temperature and information 606. Once a group of reversible-resistivity memory cells are selected, the physical address of that group of reversible-resistivity memory cells may be used for the physical address. Hence, in this manner the address allocator 602 may map a logical address to a physical address. Thus, one embodiment, comprises performing logical to physical mapping of data to the reversible-resistance memory cells based on the information 606 and the temperature.

In one embodiment, the address allocator 602 performs a logical to physical mapping of data to the reversible-resistance memory cells based on the information 606 without factoring in temperature of the data. In this embodiment, when a unit of data is to be written to the memory core 103, the address allocator 602 may access information 606 to select a group based on, for example, how difficult it was to switch the memory cells from a virgin resistance state to a target resistance state for the first time after fabrication. The information 606 may indicate which groups of reversible-resistance memory cells are expected to have better/worse than average data retention and/or endurance. In one embodiment, the address allocator 602 may have a preference for groups of memory cells for which endurance and/or data retention is expected to be higher than average, regardless of the temperature of the data.

In one embodiment, the address allocator 602 performs wear leveling. In one embodiment, wear-leveling of the reversible-resistance memory cells is based on the information 606. In one embodiment, wear-leveling of the reversible-resistance memory cells is based on the information 606 and data temperature. Using the information 606 wear-leveling can help when spreading out the wear to have a preference to write data to groups of reversible-resistance memory cells for which endurance is expected to be better than average. In other words, rather than attempting to be completely random when spreading out the wear, the wear leveling can have a preference for groups for which endurance is expected to be better than average. Conversely, wear leveling can disfavor groups for which endurance is expected to be worse than average.

Figure 12B:
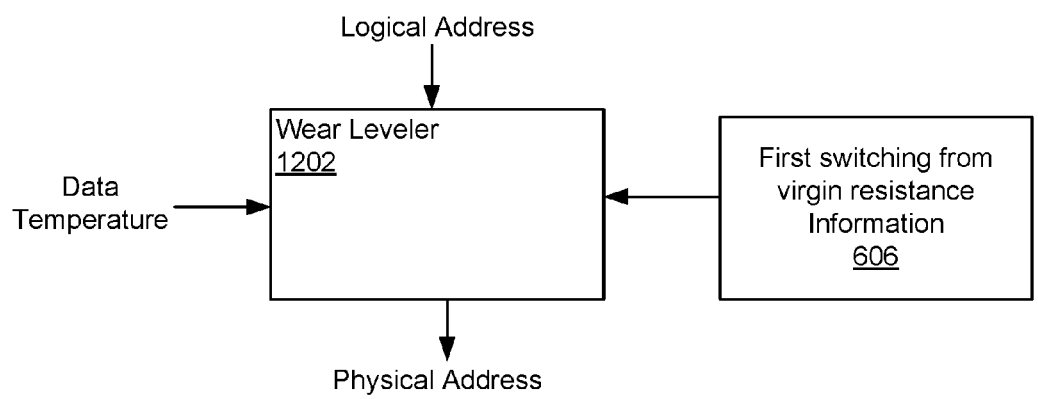
FIG. 12B is a diagram of one embodiment of in which an address allocator comprises a wear leveler.

FIG. 12B is a diagram of one embodiment of in which the address allocator 602 comprises a wear leveler 1202. The wear leveler 1202 inputs a logical address and converts it to a physical address. The wear leveler 1202 also has access to information 606. The wear leveler 1202 also has access to data temperature, but that is not required in all embodiments. Internally, the wear leveler 1202 is not limited to any particular algorithm. In one embodiment, the wear leveler 1202 has a randomizer that inputs the logical address and generates a physical address based on a randomizing operation on the logical address. Note that one or more intermediate addresses between the logical address and physical address could be generated. The wear leveler 1202 factors in the information 606 in order to generate the physical address. For example, the physical address can be selected randomly from one of the bins 1152-1158. As noted above, rather than attempting to be completely random when spreading out the wear, the wear leveler 1202 can have a preference for groups for which endurance is expected to be better than average (such as those in bin 1154 or possibly 1152). Conversely, the wear leveler 1202 can disfavor groups for which endurance is expected to be worse than average (such as those in bins 1156 and 1158).

Figure 13A:
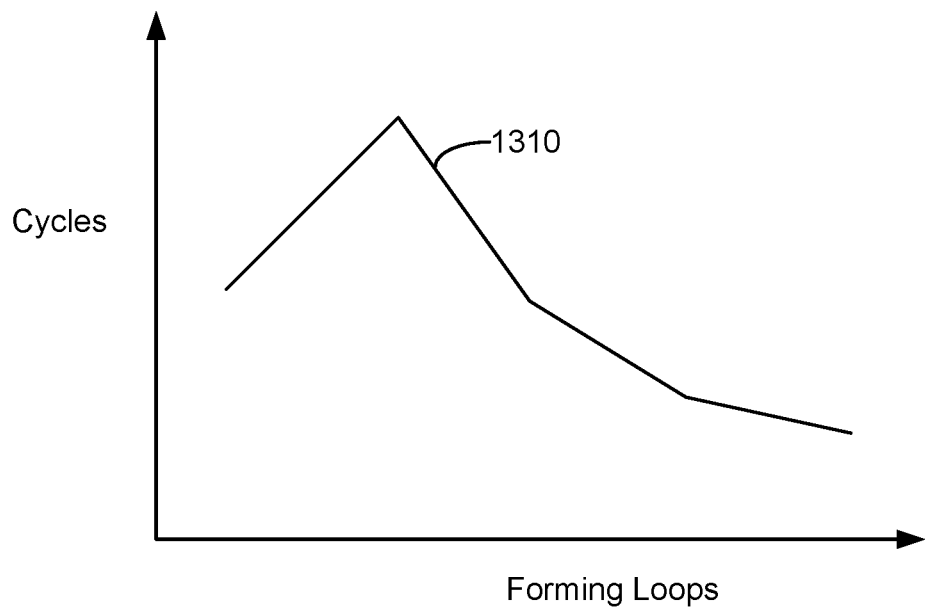
FIG. 13A is a graph to depict a possible dependence on the number of forming iterations to form an embodiment of reversible-resistance memory cells and cycles.

FIG. 13A is a graph to depict a possible dependence on the number of forming iterations to form reversible-resistance memory cell and cycles. The number of forming loops used to form the memory cell is represented on the horizontal axis. The cycles are represented on the vertical axis. A greater number of cycles may correspond to greater endurance. For this example, the curve 1310 increases initially, but then drops off. This may indicate that reversible-resistance memory cells that were the easiest to form may have worse endurance than those that were somewhat more difficult to form. The drop off with greater number of forming loops may indicate that reversible-resistance memory cells that were the most difficult to form may have the worst endurance. Note that the shape of the curve may depend on the material used for the reversible-resistance memory cell, the type of forming process, etc. Thus, it will be understood that the curve 1310 is just one example. However, the principle of characterizing endurance based on the number of forming iterations may be applied to reversible-resistivity memory cells that show other dependencies between forming loops and cycles. Also, note that a parameter other than the number of forming iterations could be used to characterize the endurance of the memory cells. For example, a parameter such as forming current limit, or possibly forming voltage might be used.

Figure 13B:
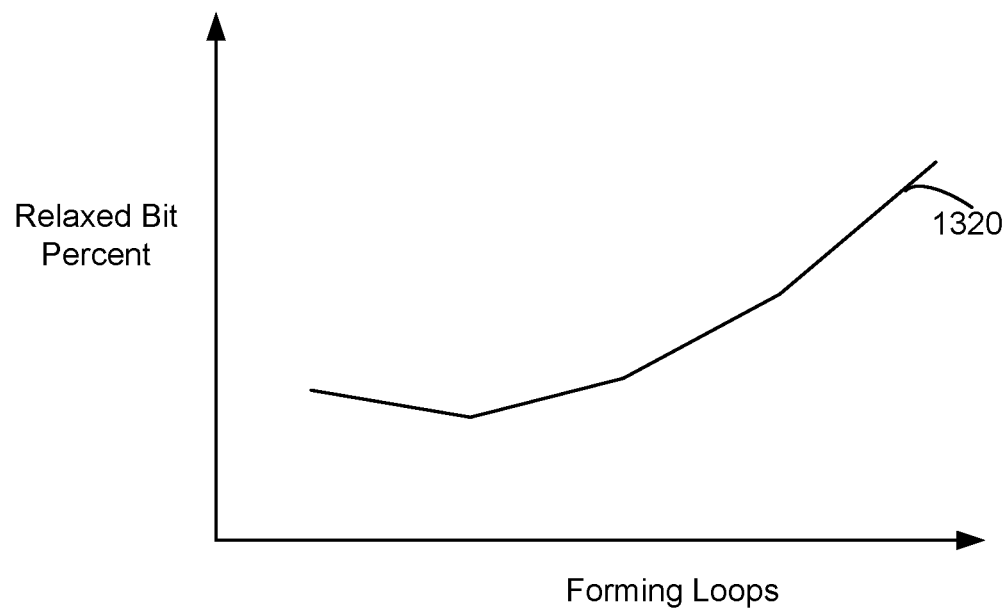
FIG. 13B is a graph to depict a possible dependence on the number of forming iterations to form an embodiment of reversible-resistance memory cells and a relaxed bit percent.

FIG. 13B is a graph to depict a possible dependence on the number of forming iterations to form reversible-resistivity memory cell and a relaxed bit percent. The number of forming iterations used to form the memory cell is represented on the horizontal axis. The relaxed bit percent is represented on the vertical axis. A lower relaxed bit percent may correspond to greater data retention. For this example, the curve 1320 decreases initially, but then increases. This may indicate that reversible-resistance memory cells that were the easiest to form may have worse data retention than those that were somewhat more difficult to form. The increase with greater number of forming loops may indicate that reversible-resistance memory cells that were the more difficult to form may have the worst data retention. Note that the shape of the curve may depend on the material used for the reversible-resistance memory cell, the type of forming process, etc. Thus, it will be understood that the curve 1320 is just one example. However, the principle of characterizing data retention based on the number of forming iterations may be applied to reversible-resistance memory cells that show other dependencies between forming iterations and cycles. Also, note that a parameter other than the number of forming iterations could be used to characterize the data retention of the memory cells. For example, a parameter such as forming current limit, or possibly forming voltage might be used.

Data such as that depicted in FIGS. 13A and 13B may be used to develop a scheme such as depicted in FIG. 11F. Note that there may be some correspondence between the inverse of curve 1310 and the bins 1152-1158. The binning scheme may place memory cells that are expected to have the highest endurance in bin 1154. The binning scheme may place memory cells that are expected to have the second highest endurance in bin 1152. The binning scheme may place memory cells that are expected to have the second worst endurance in bin 1156. The binning scheme may place memory cells that are expected to have the worst endurance in bin 1158. The binning scheme may be adapted to reversible-resistively memory cells have other endurance characteristics based on parameters used during forming (or initialization).

Also, there is some correspondence between the curve 1320 and the bins 1152-1158. The scheme may differ for different reversible-resistance memory cell materials, as well as the nature of the forming or initialization process. The binning scheme may place memory cells that are expected to have the highest data retention in bin 1154. The binning scheme may place memory cells that are expected to have the second highest data retention in bin 1152. The binning scheme may place memory cells that are expected to have the second worst data retention in bin 1156. The binning scheme may place memory cells that are expected to have the worst data retention in bin 1158. The binning scheme may be adapted to reversible-resistively memory cells have other data retention characteristics based on parameters used during forming (or initialization).

One embodiment disclosed herein includes an apparatus, comprising a plurality of reversible-resistance memory cells and a control circuit in communication with the plurality of reversible-resistance memory cells. The control circuit of the embodiment is configured to access information regarding switching groups of the reversible-resistance memory cells from a first resistance state in which the reversible-resistance memory cells are in immediately after fabrication to a second resistance state for the first time after fabrication, select a group of reversible-resistance memory cells to store data based on the information for respective ones of the groups, and store data in the selected group.

One embodiment includes a method of operating a non-volatile memory system comprising reversible-resistance memory cells. The method comprises accessing information that characterizes groups of the reversible-resistance memory cells based on how many iterations of a forming procedure were used to form the reversible-resistance memory cells in the respective groups; selecting a group of the reversible-resistance memory cells based on the information; and storing the data in the selected group.

One embodiment includes a non-volatile memory system, comprising a plurality of reversible-resistance memory cells; means for accessing stored information of difficulty in switching groups of the reversible-resistance memory cells from a virgin resistance state to a target resistance state the first time after fabrication of the reversible-resistance memory cells; means for determining a temperature of data to be stored in the memory system; means for selecting a group of the reversible-resistance memory cells based on the information and the temperature of the data; and means for storing the data in the selected group.

In one embodiment, means for determining a temperature of data to be stored in the memory system comprises controller 105, temperature of data characterizer 604 and/or other hardware and/or software.

In one embodiment, means for accessing stored information of difficulty in switching groups of the reversible-resistance memory cells from a high resistance state to a low resistance state the first time after fabrication of the reversible-resistance memory cells comprises controller 105, core control circuits 104, read/write circuits 306, address allocator 602, and/or other hardware and/or software.

In one embodiment, means for selecting a group of the reversible-resistance memory cells based on the information and the temperature of the data; and means for storing the data in the selected group, temperature of data characterizer 604, address allocator 602, and/or other hardware and/or software.

One embodiment includes a method of operating a non-volatile memory system comprising reversible-resistance memory cells, comprising: accessing information that characterizes groups of the reversible-resistance memory cells based on how many iterations of an initialization procedure were used to initialize the reversible-resistance memory cells in the respective groups; selecting a group of the reversible-resistance memory cells based on the information; and storing the data in the selected group.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "group" of objects may refer to a "group" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
   a plurality of reversible-resistance memory cells;
   a control circuit in communication with the plurality of reversible-resistance memory cells, the control circuit configured to:
      access information regarding switching groups of the reversible-resistance memory cells from a first resistance state in which the reversible-resistance memory cells are in immediately after fabrication to a second resistance state for the first time after fabrication;
      select a group of reversible-resistance memory cells to store data based on the information for respective ones of the groups; and
      store data in the selected group.

2. The apparatus of claim 1, wherein the information is based on a difficulty in switching groups of the reversible-resistance memory cells from the first resistance state to the second resistance state for the first time after fabrication.

3. The apparatus of claim 1, wherein the information is based on a difficulty in forming groups of the reversible-resistance memory cells after fabrication.

4. The apparatus of claim 1, wherein the information is based on a difficulty in initializing groups of the reversible-resistance memory cells after fabrication.

5. The apparatus of claim 1, wherein the control circuit is configured to select a group of the reversible-resistance memory cells based on both a difficulty in switching groups of the reversible-resistance memory cells from the first resistance state to the second resistance state for the first time after fabrication and a temperature of the data to be stored.

6. The apparatus of claim 5 wherein, to select a group based on both the difficulty in switching groups of the reversible-resistance memory cells from the first resistance state to the second resistance state for the first time after fabrication and a temperature of the data to be stored, the control circuit is configured to:
   store data having a first temperature in groups of reversible-resistance memory cells for which switching from the first resistance state to the second resistance state for the first time after fabrication has a first difficulty; and
   store data having a second temperature in groups of reversible-resistance memory cells for which switching from the first resistance state to a low resistance state for the first time after fabrication has a second difficulty that is greater than the first difficulty, wherein the second temperature is less than the first temperature.

7. The apparatus of claim 5 wherein, to select a group based on both the difficulty in switching from the first resistance state to the second resistance state for the first time after fabrication and a temperature of the data to be stored, the control circuit is configured to:
   store data having a first temperature in groups of reversible-resistance memory cells for which switching from the first resistance state to the second resistance state for the first time after fabrication has a first difficulty; and
   store data having a second temperature in groups of reversible-resistance memory cells for which switching from the first resistance state to the second resistance state for the first time after fabrication has a second difficulty that is greater than the first difficulty, wherein the second temperature is greater than the first temperature.

8. The apparatus of claim 7 wherein, to select a group based on both the difficulty in switching from the first resistance state to the second resistance state for the first time after fabrication and a temperature of the data to be stored, the control circuit is further configured to:
   store data having a third temperature in groups of reversible-resistance memory cells for which switching from the first resistance state to the second resistance state for the first time after fabrication has a third difficulty that is greater than both the first and second difficulties, wherein the third temperature is less than the first temperature and less than the second temperature.

9. The apparatus of claim 1, further comprising storage that stores the indication of difficulty in switching from the first resistance state to the second resistance state for the first time after fabrication, wherein the stored indication is based on how many iterations of a process is used to switch reversible-resistance memory cells in a group from the first resistance state to the second resistance state for the first time after fabrication.

10. A method of operating a non-volatile memory system comprising reversible-resistance memory cells, comprising:
   accessing information that characterizes groups of the reversible-resistance memory cells based on how many iterations of a forming procedure were used to form the reversible-resistance memory cells in the respective groups;
   selecting a group of the reversible-resistance memory cells based on the information; and
   storing data in the selected group.

11. The method of claim 10, wherein the selecting a group of the reversible-resistance memory cells is based on both the information and a temperature of data to be stored in the memory system.

12. The method of claim 11, wherein the selecting a group of the reversible-resistance memory cells based on the both the information and a temperature of data to be stored in the memory system comprises:

storing data having a first temperature in groups of the reversible-resistance memory cells for which forming is characterized by a first range of forming iterations; and storing data having a second temperature in reversible-resistance memory cells for which forming is characterized by a second range of forming iterations that is greater than the first range, wherein the second temperature is less than the first temperature.

13. The method of claim 11, wherein the selecting a group of the reversible-resistance memory cells based on the both the information and a temperature of data to be stored in the memory system comprises:

storing data having a first temperature in reversible-resistance memory cells for which forming is characterized by a first range of forming iterations; and storing data having a second temperature in reversible-resistance memory cells for which forming is characterized by a second range of forming iterations that is less than the first range, wherein the second temperature is less than the first temperature.

14. The method of claim 13, wherein the selecting a group of the reversible-resistance memory cells based on the both the information and a temperature of data to be stored in the memory system further comprises:

storing data having a third temperature in reversible-resistance memory cells for which forming has a third range of forming iterations that is greater than both the first and second ranges, wherein the third temperature is less than the first temperature and less than the second temperature.

15. The method of claim 10, wherein the selecting a group of the reversible-resistance memory cells based on the information comprises:

performing logical to physical mapping of data to the reversible-resistance memory cells based on the information.

16. The method of claim 10, wherein the selecting a group of the reversible-resistance memory cells based on the information comprises:

performing wear-leveling of the reversible-resistance memory cells based on the information.

17. A non-volatile memory system, comprising:

a plurality of reversible-resistance memory cells;

means for accessing stored information of difficulty in switching groups of the reversible-resistance memory cells from a virgin resistance state to a target resistance state the first time after fabrication of the reversible-resistance memory cells;

means for determining a temperature of data to be stored in the memory system;

means for selecting a group of the reversible-resistance memory cells based on the information and the temperature of the data; and means for storing the data in the selected group.

18. The non-volatile memory system of claim 17, wherein the means for selecting a group of the reversible-resistance memory cells based on the information and the temperature of the data comprises means for storing colder data into groups of the reversible-resistance memory cells for which the stored information indicates data retention or endurance is expected to be worse than average and means for storing warmer data into groups of the reversible-resistance memory cells for which the stored information indicates data retention or endurance is expected to be better than average.

19. The non-volatile memory system of claim 17, wherein the means for selecting a group of the reversible-resistance memory cells based on the information and the temperature of the data comprises means for storing warm data in groups of the reversible-resistance memory cells for which switching from a high resistance state to a low resistance state the first time after fabrication was easiest, means for storing hot data in groups of the reversible-resistance memory cells for which switching from a high resistance state to a low resistance state the first time after fabrication was second easiest, means for storing cold data in groups of the reversible-resistance memory cells for which switching from a high resistance state to a low resistance state the first time after fabrication was second most difficult, and means for storing coldest data in groups of the reversible-resistance memory cells for which switching from a high resistance state to a low resistance state the first time after fabrication was the most difficult.

20. The non-volatile memory system of claim 17, further comprising:

means for performing wear-leveling of the plurality of reversible-resistance memory cells based on the stored information and the temperature of the data.

21. A method of operating a non-volatile memory system comprising reversible-resistance memory cells, comprising:

accessing information that characterizes groups of the reversible-resistance memory cells based on how many iterations of an initialization procedure were used to initialize the reversible-resistance memory cells in the respective groups;

selecting a group of the reversible-resistance memory cells based on the information; and storing data in the selected group.

* * * * *